US012772532B2

(12) United States Patent
Sampath et al.

(10) Patent No.: US 12,772,532 B2
(45) Date of Patent: Oct. 20, 2026

(54) GATE TRENCH POWER SEMICONDUCTOR DEVICES HAVING DEEP TRENCH SHIELD CONNECTION PATTERNS

(71) Applicant: Wolfspeed, Inc., Durham, NC (US)

(72) Inventors: Madankumar Sampath, Morrisville, NC (US); Woongsun Kim, Cary, NC (US); Naeem Islam, Morrisville, NC (US); Sei-Hyung Ryu, Cary, NC (US)

(73) Assignee: Wolfspeed, Inc., Durham, NC (US)

( * ) Notice: Subject to any disclaimer, the term of this patent is extended or adjusted under 35 U.S.C. 154(b) by 447 days.

(21) Appl. No.: 18/417,348

(22) Filed: Jan. 19, 2024

(65) Prior Publication Data

US 2025/0241040 A1 Jul. 24, 2025

(51) Int. Cl.

*H10D 30/66* (2025.01)
*H10D 62/17* (2025.01)
*H10D 64/00* (2025.01)
*H10D 62/10* (2025.01)
*H10D 62/832* (2025.01)

(52) U.S. Cl.

CPC ......... *H10D 64/117* (2025.01); *H10D 30/662* (2025.01); *H10D 30/668* (2025.01); *H10D 62/393* (2025.01); *H10D 62/127* (2025.01); *H10D 62/8325* (2025.01)

(58) Field of Classification Search

None
See application file for complete search history.

(56) References Cited

U.S. PATENT DOCUMENTS

| | | | | |
|---|---|---|---|---|
| 2018/0358454 A1* | 12/2018 | Okumura | ............. | H10D 12/032 |
| 2019/0081624 A1* | 3/2019 | Zhang | .................. | H03K 17/127 |
| 2019/0165162 A1 | 5/2019 | Kobayashi et al. | | |
| 2020/0203513 A1* | 6/2020 | Konrath | ............... | H10D 12/031 |
| 2021/0020740 A1* | 1/2021 | Siemieniec | .......... | H10D 12/031 |

(Continued)

FOREIGN PATENT DOCUMENTS

| | | | | |
|---|---|---|---|---|
| DE | 102015113493 A1 * | 2/2017 | ........... | H10D 30/668 |
| JP | 7337469 B1 | 8/2023 | | |
| KR | 20220025508 A * | 3/2022 | ........... | H10D 30/668 |

OTHER PUBLICATIONS

"Notification of Transmittal of the International Search Report and the Written Opinion of the International Searching Authority, or the Declaration for corresponding International Application No. PCT/US2024/062034, mailing date: Jul. 3, 2025, (20 pages)".

(Continued)

*Primary Examiner* — Scott B Geyer
(74) *Attorney, Agent, or Firm* — Myers Bigel, P.A.

(57) ABSTRACT

A semiconductor device comprises a semiconductor layer structure that has a gate trench therein and a source metallization layer on the semiconductor layer structure. The semiconductor layer structure comprises a drift region having a first conductivity type, a trench shield that has a second conductivity type, the trench shield positioned underneath the gate trench, and a trench shield connection pattern that has the second conductivity type, the trench shield connection pattern electrically connecting the trench shield to the source metallization layer, where the trench shield connection pattern extends deeper into the semiconductor layer structure than the trench shield.

20 Claims, 13 Drawing Sheets

(56) References Cited

U.S. PATENT DOCUMENTS

| | | | | |
|---|---|---|---|---|
| 2022/0130998 | A1* | 4/2022 | Kim | H10D 12/031 |
| 2023/0045172 | A1* | 2/2023 | Joo | H10D 12/481 |
| 2023/0100800 | A1* | 3/2023 | Yilmaz | H10D 64/513<br>257/288 |
| 2023/0307529 | A1* | 9/2023 | Kim | H10D 12/032 |
| 2023/0411511 | A1* | 12/2023 | Oh | H10D 12/031 |
| 2025/0142877 | A1* | 5/2025 | Kim | H10D 30/0297 |
| 2025/0169105 | A1* | 5/2025 | Kim | H10D 30/0297 |

OTHER PUBLICATIONS

"Invitation to Pay Additional Fees and, Where Applicable, Protest Fee, for corresponding Application No. PCT/US2024/062034, dated May 12, 2025, 16 pages".

* cited by examiner

GATE TRENCH POWER SEMICONDUCTOR DEVICES HAVING DEEP TRENCH SHIELD CONNECTION PATTERNS

FIELD OF THE INVENTION

The present invention relates to power semiconductor devices and, more particularly, to power semiconductor devices having gate trenches and to methods of fabricating such devices.

BACKGROUND

The Metal Oxide Semiconductor Field Effect Transistor ("MOSFET") is a well-known type of semiconductor transistor that may be used as a switch. A MOSFET is a three terminal device that has gate, drain and source terminals and a semiconductor body. The semiconductor body is referred to herein as a "semiconductor layer structure" and may include one or more semiconductor layers/regions. A source region and a drain region are formed in the semiconductor layer structure and are separated by a channel region. A gate electrode (which may act as the gate terminal or be electrically connected to the gate terminal) is disposed adjacent the channel region and separated from the channel region by a thin oxide layer. A MOSFET may be turned on or off by setting a bias voltage that is applied to the gate electrode to be above or below a threshold value. When a MOSFET is turned on (i.e., it is in its "on-state"), current is conducted through the channel region between the source and drain regions. When the bias voltage is reduced below the threshold level, the current ceases to conduct through the channel region.

An n-type MOSFET has source and drain regions that have n-type (electron) conductivity and a channel region that has p-type (hole) conductivity (i.e., an "n-p-n" design). An n-type MOSFET turns on when a gate bias voltage is applied to the gate electrode that is sufficient to create a conductive n-type inversion layer in the p-type channel region, thereby electrically connecting the n-type source and drain regions and allowing for majority carrier conduction therebetween. A p-type MOSFET has a "p-n-p" design (i.e., p-type source and drain regions and an n-type channel region) and turns on when a gate bias voltage is applied to the gate electrode that is sufficient to create a conductive p-type inversion layer in the n-type channel region to electrically connect the p-type source and drain regions. Herein, the terms "first conductivity type" and "second conductivity type" are used to indicate either n-type or p-type, where the first and second conductivity types are different. Thus, if a first region of a device has a first conductivity type and a second region of the device has a second conductivity type, this means either that the first region has n-type conductivity and the second region has p-type conductivity or, alternatively, that first region has p-type conductivity and the second region has n-type conductivity.

As noted above, the gate electrode of a MOSFET is separated from the channel region by a thin oxide layer that is called a gate oxide layer. Other non-oxide gate dielectric layers may be used in certain applications in place of the gate oxide layer. It will be appreciated that the techniques according to embodiments of the present invention that are described herein are equally applicable to devices having gate dielectric layers formed with materials other than oxides.

Because the gate electrode of a MOSFET is insulated from the channel region by the gate oxide layer, minimal gate current is required to maintain the MOSFET in its on-state or to switch the MOSFET between its off-state and its on-state. The gate current is kept small during switching because the gate forms a capacitor with the channel region. Thus, only minimal charging and discharging current is required during switching, allowing for less complex gate drive circuitry and faster switching speeds. MOSFETs may be stand-alone devices or may be combined with other circuit devices. For example, an Insulated Gate Bipolar Transistor ("IGBT") is a semiconductor device that includes both a MOSFET and a Bipolar Junction Transistor ("BJT") that combines the high impedance gate electrode of the MOSFET with the small on-state conduction losses that may be provided by a BJT. An IGBT may be implemented, for example, as a Darlington pair that includes a high voltage n-channel MOSFET at the input and a BJT at the output. The base current of the BJT is supplied through the channel of the MOSFET, thereby allowing a simplified external drive circuit (since the drive circuit only charges and discharges the gate electrode of the MOSFET).

In some applications, MOSFETs may need to carry large currents and/or be capable of blocking high voltages. Such MOSFETs are often referred to as "power" MOSFETs. Power MOSFETs are often fabricated from wide band-gap semiconductor materials (herein, the term "wide band-gap semiconductor" encompasses any semiconductor having a band-gap of at least 1.4 eV). Power semiconductor devices are often formed in silicon carbide ("SiC"), which has a number of advantageous characteristics including, for example, a high electric field breakdown strength, high thermal conductivity, high electron mobility, high melting point and high-saturated electron drift velocity.

Power semiconductor devices such as power MOSFETs can have a lateral structure or a vertical structure. In a device having a lateral structure, the terminals of the device (e.g., the drain, gate and source terminals for a power MOSFET) are on the same major surface (i.e., top or bottom) of a semiconductor layer structure. In contrast, in a device having a vertical structure, at least one terminal is provided on each major surface of the semiconductor layer structure (e.g., in a vertical MOSFET, the source and gate may be on the top surface of the semiconductor layer structure and the drain may be on the bottom surface of the semiconductor layer structure). A vertical power semiconductor device can typically support higher on-state currents and block higher voltages in the reverse blocking state than a correspondingly-sized lateral power semiconductor device.

The semiconductor layer structure of a power semiconductor device typically includes an "active region" in which one or more functional semiconductor devices are formed. The active region acts as a main junction for blocking voltage during reverse bias (off-state) operation and for providing current flow during forward bias (on-state) operation. The power semiconductor device may also have an edge termination structure such as guard rings or a junction termination extension in a termination region of the semiconductor layer structure that is adjacent (and typically surrounding) the active region. The edge termination structure may, among other things, reduce electric field crowding effects that can occur at the outer edges of a power semiconductor device. Typically, multiple power semiconductor devices are formed in/on a common wafer (e.g., a semiconductor wafer), and each power semiconductor device will have its own edge termination structure. After the wafer is fully processed, the resultant structure may be diced to separate the individual edge-terminated power semiconductor devices. Each power semiconductor device may have a unit cell structure in which the active region of each power semiconductor device includes a plurality of individual "unit cell" devices that are electrically connected in parallel and that together function as a single power semiconductor device.

Vertical power semiconductor devices that include a MOSFET can have a planar gate electrode design in which the gate electrode of the transistor is formed on top of the semiconductor layer structure or, alternatively, may have the gate electrode in a gate trench within the semiconductor layer structure, which are typically referred to as gate trench MOSFETs. With the planar gate electrode design, the channel region of each unit cell transistor is horizontally disposed underneath the gate electrode. In contrast, in the gate trench MOSFET design, the channels are typically vertically disposed adjacent sidewalls of the gate electrodes. Gate trench MOSFETs may provide enhanced performance, but typically require a more complicated manufacturing process.

One failure mechanism for a power MOSFET is the so-called "breakdown" of the gate oxide layer. The gate oxide layer is subjected to high electric fields during normal device operation. The stress on the gate oxide layer caused by these electric fields generates defects in the oxide material, and these defects build up over time. When the concentration of defects reaches a critical value, a so-called "percolation path" may be created through the gate oxide layer that electrically connects the gate electrode to the source region, thereby creating a short-circuit that can destroy the device. The "lifetime" of a gate oxide layer (i.e., how long the device can be operated before breakdown occurs) is a function of, among other things, the magnitude of the electric field that the gate oxide layer is subjected to and the length of time for which the electric field is applied. FIG. 1 is a schematic graph illustrating the relationship between the operating time until breakdown occurs (the "gate oxide lifetime") and the level of the electric field applied to the gate oxide layer. This graph assumes that the same electric field is always applied (which is not necessarily the case). As shown in FIG. 1, the relationship may, in some cases, be generally linear when the gate oxide lifetime is plotted on a logarithmic scale. The important point to take from FIG. 1 is that as the electric field level is increased, the lifetime of the gate oxide layer decreases exponentially. The lifetime of the gate oxide layer may be increased by increasing the thickness of the gate oxide layer, but various performance parameters of a MOSFET may be a function of the thickness of the gate oxide layer and thus increasing the thickness of the gate oxide layer is typically not an acceptable way of increasing the lifetime of the gate oxide layer.

SUMMARY

Pursuant to some embodiments of the present invention, semiconductor devices are provided that comprise a semiconductor layer structure that has a gate trench therein and a source metallization layer on the semiconductor layer structure. The semiconductor layer structure comprises a drift region having a first conductivity type, a trench shield that has a second conductivity type, the trench shield positioned underneath the gate trench, and a trench shield connection pattern that has the second conductivity type, the trench shield connection pattern electrically connecting the trench shield to the source metallization layer, where the trench shield connection pattern extends deeper into the semiconductor layer structure than the trench shield.

In some embodiments, the trench shield connection pattern extends below and vertically overlaps the trench shield.

In some embodiments, a longitudinal axis of the gate trench extends in a first direction, and a longitudinal axis of the trench shield connection pattern extends in a second direction that is perpendicular to the first direction.

In some embodiments, the gate trench is one of a plurality of gate trenches, the trench shield is one of a plurality of trench shields that extend underneath the respective gate trenches, and the trench shield connection pattern is one of a plurality of trench shield connection patterns, and the gate trenches extend in parallel to each other, the semiconductor device further comprising a plurality of gate electrodes in the respective gate trenches. In some embodiments, each trench shield connection pattern crosses below multiple of the gate trenches. In some embodiments, each trench shield connection pattern extends as a stripe in the semiconductor layer structure. In some embodiments, each trench shield connection pattern includes a plurality of first portions that are in between the gate trenches and a plurality of second portions that are underneath the gate trenches. In some embodiments, the second portions of the trench shield connection patterns extend deeper into the semiconductor layer structure than the first portions of the trench shield connection patterns. In some embodiments, the first portions of the trench shield connection patterns extend deeper into the semiconductor layer structure than the gate trenches. In some embodiments, the first portions of the trench shield connection patterns extend to the upper surface of the semiconductor layer structure.

In some embodiments, the semiconductor layer structure further comprising a plurality of well regions that have the second conductivity type on the drift region and a plurality of source regions that have the first conductivity type on the respective well regions opposite the drift region. In some embodiments, the semiconductor layer structure further comprises a plurality of well contact regions having the second conductivity type on the respective well regions opposite the drift region, the well contact regions having a doping concentration that is at least five times greater than a doping concentration of the well regions. In some embodiments, the well contact regions are arranged in a plurality of columns and rows when the semiconductor layer structure is viewed in plan view, and each well contact region is surrounded by a respective one of the source regions when the semiconductor layer structure is viewed in plan view. In some embodiments, each column of well contact regions extends in between a respective pair of trench shield connection patterns.

In some embodiments, the semiconductor layer structure comprises a silicon carbide semiconductor layer structure.

In some embodiments, the trench shield connection pattern has a planar lowermost surface.

In some embodiments, the semiconductor device comprises a MOSFET.

In some embodiments, the well regions have longitudinal axes that extend in a first direction, and the trench shield connection patterns have longitudinal axes that extend in a second direction that is perpendicular to the first direction.

In some embodiments, the gate trench includes a central section that extends to a first depth in the semiconductor layer structure, and further has a plurality of widened sections that are on at least one side of the central section and spaced-apart from each other. In some embodiments, each widened section extends to a second depth in the semiconductor layer structure that is less than the first depth.

In some embodiments, the trench shield has a constant depth into the semiconductor layer structure.

Pursuant to further embodiments of the present invention, semiconductor devices are provided that comprise a semiconductor layer structure that comprises a drift region having a first conductivity type, well region having a second conductivity type positioned above the drift region, a trench shield having the second conductivity type and has a longitudinal axis that extends in a first direction, and a trench shield connection pattern that has the second conductivity type and has a longitudinal axis that extends in a second direction that is different than the first direction. In these devices, a portion of the trench shield connection pattern extends deeper into the semiconductor layer structure than the trench shield.

In some embodiments, the second direction is perpendicular to the first direction.

In some embodiments, the trench shield connection pattern extends below and vertically overlaps the trench shield.

In some embodiments, the semiconductor layer structure has a plurality of gate trenches therein that extend in the first direction, the semiconductor device further comprising a plurality of gate electrodes in the respective gate trenches. In some embodiments, the trench shield connection pattern is one of a plurality of trench shield connection patterns that have the second conductivity type, and at least some of the trench shield connection patterns cross below multiple of the gate trenches. In some embodiments, a first of the trench shield connection patterns includes a first portion that is in between first and second of the gate trenches and a second portion that extends underneath at least the first gate trench. In some embodiments, the second portion of the first trench shield connection pattern extends further into the semiconductor layer structure than the first portion of the first trench shield connection pattern, and the first portion of the first trench shield connection pattern extends to an upper surface of the semiconductor layer structure. In some embodiments, a lowermost surface of the first portion of the first trench shield connection pattern extends deeper into the semiconductor layer structure than the gate trenches.

In some embodiments, the well region is one of a plurality of well regions having the second conductivity type, the semiconductor layer structure further comprising a plurality of source regions having the first conductivity type on the respective well regions opposite the drift region. In some embodiments, the semiconductor layer structure further comprising a plurality of well contact regions having the second conductivity type on the respective well regions opposite the drift region, the well contact regions having a doping concentration that is at least five times greater than a doping concentration of the well regions. In some embodiments, the well contact regions are arranged in a plurality of columns and rows when the semiconductor layer structure is viewed in plan view, and each well contact region is surrounded by a respective one of the source regions when the semiconductor layer structure is viewed in plan view. In some embodiments, each column of well contact regions extends in between a respective pair of trench shield connection patterns.

In some embodiments, the semiconductor layer structure comprises a silicon carbide semiconductor layer structure.

In some embodiments, the semiconductor device comprises a MOSFET.

In some embodiments, each gate trench includes a central section that extends to a first depth in the semiconductor layer structure, and further has a plurality of widened sections that are on at least one side of the central section and spaced-apart from each other. In some embodiments, each widened section extends to a second depth in the semiconductor layer structure that is less than the first depth.

In some embodiments, the trench shield has a constant depth into the semiconductor layer structure.

Pursuant to additional embodiments of the present invention, semiconductor devices are provided that comprise a semiconductor layer structure that has a gate trench therein, the gate trench having a longitudinal axis that extends in a first direction. The semiconductor layer structure comprises a drift region having a first conductivity type, a trench shield that has the second conductivity type extending underneath the gate trench, and a trench shield connection pattern that has the second conductivity type, the trench shield connection pattern including a first portion that extends to an upper surface of the semiconductor layer structure and a second portion that extends through and underneath the trench shield.

In some embodiments, the gate trench is one of a plurality of gate trenches, and the trench shield connection pattern extends below and vertically overlaps at least two of the gate trenches.

In some embodiments, the trench shield connection pattern extends in a second direction that is perpendicular to the first direction.

In some embodiments, the second portion of the trench shield connection pattern extends deeper into the semiconductor layer structure than the first portion of the trench shield connection pattern.

In some embodiments, the second portion of the trench shield connection pattern extends to the same depth into the semiconductor layer structure as the first portion of the trench shield connection pattern.

In some embodiments, the semiconductor layer structure comprises a silicon carbide semiconductor layer structure, and the semiconductor device comprises a MOSFET.

In some embodiments, the gate trench includes a central section that extends to a first depth in the semiconductor layer structure, and further has a plurality of widened sections that are on at least one side of the central section and spaced-apart from each other. In some embodiments, each widened section extends to a second depth in the semiconductor layer structure that is less than the first depth.

In some embodiments, the trench shield has a constant depth into the semiconductor layer structure.

Pursuant to still further embodiments of the present invention, methods of forming a semiconductor device are provided. Pursuant to these methods, a semiconductor layer structure is provided that comprises a drift region having a first conductivity type and a well region having a second conductivity type. The semiconductor layer structure is etched to form a preliminary gate trench therein, the gate trench having a longitudinal axis that extends in a first direction. The semiconductor layer structure thereafter is further etched to deepen the preliminary gate trench and to simultaneously form a plurality of additional openings in the semiconductor layer structure to convert the preliminary gate trench into a gate trench that has a central section that has a first depth and a plurality of widened second sections that have a second depth.

In some embodiments, the method may further comprise forming an etch mask and patterning the etch mask before etching the semiconductor layer structure to form a preliminary gate trench therein, and then further patterning the etch mask before etching the semiconductor layer structure to deepen the preliminary gate trench and to simultaneously form the plurality of additional openings in the semiconductor layer structure to convert the preliminary gate trench into the gate trench.

In some embodiments, the method may further comprise forming a trench shield having the second conductivity type in the semiconductor layer structure after forming the preliminary gate trench but before converting preliminary gate trench into the gate trench.

In some embodiments, the method may further comprise forming a trench shield connection pattern having the second conductivity type in the semiconductor layer structure after converting preliminary gate trench into the gate trench.

In some embodiments, the trench shield extends in the first direction underneath the gate trench, and the trench shield connection pattern extends in a second direction that crosses the first direction.

In some embodiments, the trench shield connection pattern extends deeper into the semiconductor layer structure than the trench shield.

In some embodiments, the trench shield connection pattern extends below and vertically overlaps the gate trench and the trench shield.

In some embodiments, the second direction is perpendicular to the first direction and the second depth is less than the first depth.

In some embodiments, the trench shield connection pattern includes a first portion that extends to an upper surface of the semiconductor layer structure and a second portion that is underneath the gate trench, where the second portion extends deeper into the semiconductor layer structure than the first portion.

In some embodiments, the trench shield connection pattern includes a third portion that extends deeper into the semiconductor layer structure than the first portion and less deep into the semiconductor layer structure than the second portion.

Pursuant to additional embodiments of the present invention, other methods of forming a semiconductor device are provided. Pursuant to these methods, a semiconductor layer structure is provided that comprises a drift region having a first conductivity type and a well region having a second conductivity type. A gate trench is formed in the semiconductor layer structure, the gate trench having a longitudinal axis that extends in a first direction. A trench shield is formed in the semiconductor layer structure that has the second conductivity type. A trench shield connection pattern is formed in the semiconductor layer structure that has the second conductivity type. The trench shield extends in the first direction underneath the gate trench, and the trench shield connection pattern extends in a second direction that crosses the first direction. The trench shield connection pattern extends deeper into the semiconductor layer structure than the trench shield.

In some embodiments, the trench shield connection pattern extends below and vertically overlaps the gate trench and the trench shield and the second direction is perpendicular to the first direction.

In some embodiments, the trench shield connection pattern includes a first portion that extends to an upper surface of the semiconductor layer structure and a second portion that is underneath the gate trench and that extends deeper into the semiconductor layer structure than the first portion.

In some embodiments, the method further comprising selectively etching the gate trench to form a plurality of spaced-apart widened sections.

In some embodiments, the trench shield connection pattern extends through the trench shield.

Pursuant to yet additional embodiments of the present invention, semiconductor devices are provided that comprise a silicon carbide semiconductor layer structure that has a gate trench therein. The semiconductor layer structure comprises a drift region having a first conductivity type, a JFET region having the first conductivity type on the drift region, the JFET region having a high first conductivity type dopant concentration than the drift region, a well region having a second conductivity type on the drift region opposite the JFET region, a source region having the first conductivity type on the well region opposite the drift region, and a trench shield that has the second conductivity type, the trench shield positioned underneath the gate trench. A bottom surface of the trench shield is between 0.1 and 10 microns below a bottom surface of the gate trench and the semiconductor device has a rated blocking voltage of between 500 and 3000 volts.

In some embodiments, a maximum second conductivity type doping concentration of the trench shield is between $1\times10^{17}$ and $1\times10^{19}$ dopants/$cm^3$.

DETAILED DESCRIPTION

Figure 1:
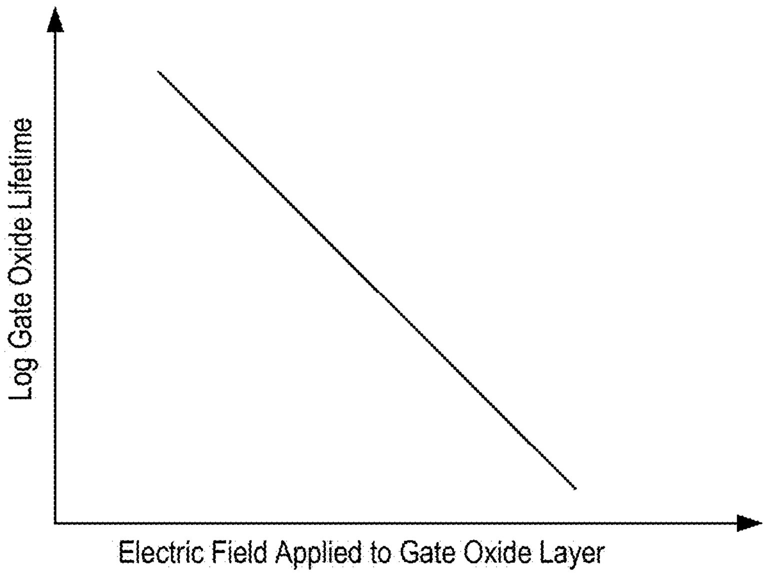
FIG. 1 is a semi-log graph illustrating the relationship between the lifetime of the gate oxide layer as a function of applied electric field strength.

Vertical silicon carbide based power semiconductor devices that have gate trenches such as vertical power MOSFETs and IGBTs are attractive for many applications due to their inherent lower specific on-resistance, which may result in more efficient operation for power switching operations. The channels in a gate trench vertical power device are formed in the sidewalls of the gate trenches, and hence are vertical channels. The carrier mobility in these vertically-oriented sidewall channels may be about 2-4 times higher than the corresponding carrier mobility in the horizontal channel of a standard planar gate (i.e., non-gate trench) vertical power device, which results in increased current density during on-state operation allowing for higher switching speeds. The gate trench design also reduces the overall pitch of the device, which increases device integration. The lower conduction losses (due to the reduced on-state resistance) and improved switching speeds make gate trench power devices particularly well-suited for high frequency power applications having low to moderate voltage blocking requirements (e.g., 600-1200 Volts). These devices may have reduced requirements for associated passive components and require relatively simple cooling schemes. As MOSFETs are the most widely used silicon carbide based gate trench power semiconductor devices, the discussion below focuses on MOSFET embodiments. It will be appreciated, however, that each of the described embodiments may alternatively be implemented using non-oxide gate dielectric layers (e.g., nitrides, high dielectric constant materials, etc.), and that the same techniques may be used to form other gate trench power semiconductor devices such as IGBTs, gate-controlled thyristors and the like.

As discussed above, gate trench power MOSFETs are susceptible to oxide reliability issues due to the presence of high electric fields in the gate oxide layers that line the bottoms and sidewalls of the gate trenches. The high electric fields degrade the gate oxide layer over time, and may eventually result in failure of the device. When gate trench MOSFETs operate in reverse blocking operation (i.e., when the MOSFET is in its off-state), the source terminal of the MOSFET is typically grounded, the gate terminal is typically grounded or at a negative bias voltage, and the drain terminal is typically at a high positive voltage. During such reverse blocking operations, high electric fields extend upwardly from the drain terminal (which is on the bottom surface of the semiconductor layer structure) toward the top surface of the semiconductor layer structure. Thus, under reverse blocking operation, the bottom portion of the gate dielectric layer experiences the highest electric field levels. Due to electric field crowding effects, the electric field levels in the lower "corners" of the gate oxide layer at the bottom edges of the gate trench may be particularly high (i.e., the portions of the gate oxide layers that cover the region where the sidewalls of the gate trenches merge into the bottom of the gate trenches). Moreover, due to the difference in permittivity between silicon carbide and silicon oxide, the electric field in a silicon oxide gate oxide layer may be about 2.6 times higher than the electric field in the silicon carbide semiconductor layer structure adjacent the gate oxide layer. Breakdown of the silicon oxide occurs when the electric field reaches a critical level. In order to avoid such breakdown, power MOSFETs may be operated with the drain voltage at lower levels during reverse blocking operation to ensure that the electrical field does not reach a level that will result in breakdown. In other words, the voltage rating of a power MOSFET may be set to ensure that premature gate oxide breakdown will not occur.

So-called "trench shields" (also called "bottom shields") are often provided underneath the gate trenches of gate trench power MOSFETs in order to reduce the electric field levels in the bottom portion of the gate oxide layer during reverse blocking operation. These trench shields are formed by doping the portions of the semiconductor layer structure underneath the gate trenches with dopants having the same conductivity type as the dopants included in the channel regions of the device. The trench shields are typically formed via one or more ion implantation processes in which p-type dopant ions (for an n-type MOSFET) are implanted through the bottom surfaces of the gate trenches. The trench shields may, for example, extend downwardly 0.5 to 1.0 microns or more from the bottoms of the gate trenches into the semiconductor layer structure of the device, and are moderately to highly doped regions. The trench shields are electrically connected to the source terminal of the MOSFET by p-type trench shield connection patterns.

Gate trench power MOSFETs may further include additional shielding regions that are referred to as "support shields." The support shields are formed in the semiconductor layer structure between adjacent gate trenches and, like the trench shields, may comprise moderately or highly doped semiconductor regions having the same conductivity type as the channel regions of the MOSFET. The support shields may, for example, extend to the same depth in the semiconductor layer structure as the trench shields and may be formed by a high-energy ion implantation process. The support shields may directly connect to the source metallization in the active region of the device.

Figure 2:
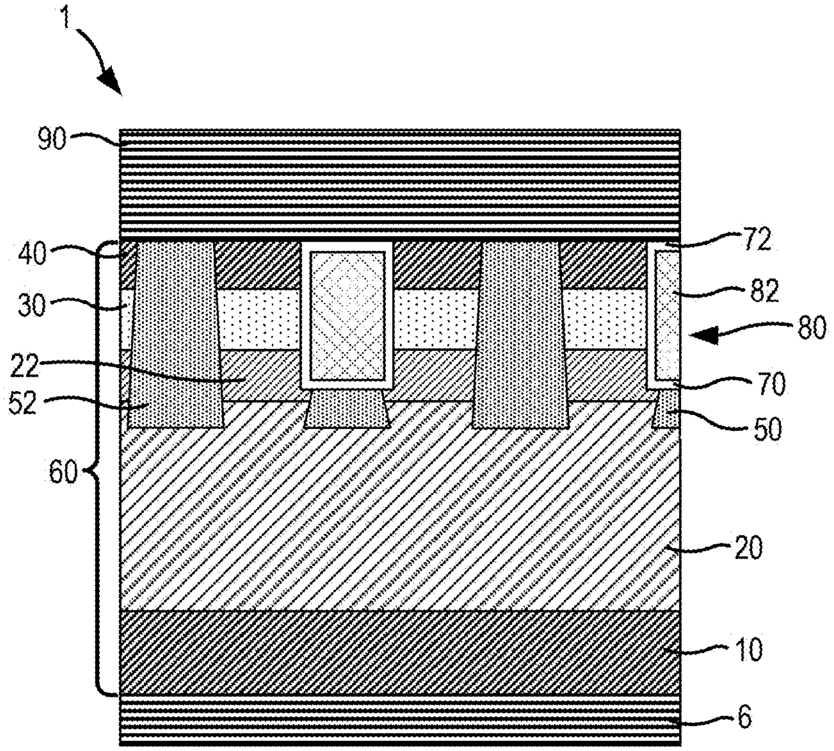
FIG. 2 is a schematic cross-sectional view of a unit cell of a conventional gate trench power MOSFET.

FIG. 2 is a schematic cross-sectional view of a small portion of a silicon carbide power MOSFET 1 that includes support shields. The cross-section of FIG. 2 shows one full unit cell of the MOSFET 1 and portions of two adjacent unit cells. As shown in FIG. 2, the MOSFET 1 includes a heavily-doped n-type (n+) silicon carbide semiconductor substrate 10. A lightly-doped n-type ($n^-$) silicon carbide drift region 20 is provided on the upper surface of the substrate 10. A plurality of n-type silicon carbide JFET regions 22 are formed on or in the upper portion of the drift region 20. The JFET regions 22 may be more heavily doped than the remainder of the drift region 20. Moderately-doped (p) silicon carbide p-type wells 30 (also referred to as "p-wells") are provided on the upper surfaces of the respective n-type JFET regions 22. Heavily-doped ($n^+$) n-type silicon carbide source regions 40 are formed on upper portions of the p-wells 30. The substrate 10, drift region 20, JFET regions 22, p-wells 30, and source regions 40 are part of a semiconductor layer structure 60 of the MOSFET 1.

The semiconductor layer structure 60 further includes p-type support shields 52 that extend downwardly from an upper portion (e.g., the upper surface) of the semiconductor layer structure 60. The p-type support shields 52 may be moderately (p) or heavily doped ($p^+$) silicon carbide regions, and are typically formed by ion implantation. As is further shown in FIG. 2, a plurality of gate trenches 80 are formed in the upper portion of the semiconductor layer structure 60. The semiconductor layer structure 60 also includes p-type trench shields 50 that are formed underneath the respective gate trenches 80, typically by implanting p-type dopants through the bottoms of the gate trenches 80. The p-type trench shields 50 extend underneath the respective gate trenches 80 for all or substantially all of the length of each gate trench 80 and may be moderately (p) or heavily doped ($p^+$) silicon carbide regions. The p-type support shields 52 and the p-type trench shields 50 act to reduce the electric field levels that form in gate oxide layers during reverse blocking operation.

A gate oxide layer 70 is formed conformally within each gate trench 80, and gate electrodes 82 are formed in the gate trenches 80 on the gate oxide layers 70. An intermetal dielectric pattern 72 covers the gate electrodes 82. A source metallization layer 90 is formed on the intermetal dielectric pattern 72 and on the heavily-doped n-type source regions 40 and upper portions of the support shields 52. A drain contact 6 is formed on the lower surface of the substrate 10.

While the provision of support shields 52 in gate trench power MOSFET 1 may provide increased protection to the gate oxide layer 70, the support shields 52 may increase the "pitch" of the MOSFET 1. In particular, the pitch of a power MOSFET refers to the distance between adjacent unit cells. When support shields are added to a gate trench power MOSFET, it may be necessary to increase the spacing between adjacent gate trenches 80 to make room for the support shields 52, thereby increasing the pitch, which reduces the integration level of the MOSFET. Adding support shields 52 to MOSFET 1 also typically adds several additional processing steps (e.g., masking, ion implantation and/or mask removal steps), which increases fabrication costs. Thus, there are tradeoffs involved in adding support shields 52 to a gate trench power MOSFET or other power semiconductor device.

Pursuant to embodiments of the present invention, gate trench silicon carbide power MOSFETs (and other power semiconductor devices) are provided that have deep trench shield connection patterns. These deep trench shield connection patterns may extend deeper into the semiconductor layer structure than the trench shields. As discussed above, the gate oxide layers of a gate trench power semiconductor device are subject to high electric fields during reverse blocking operation, which acts to damage the gate oxide layers over time. The present invention is based, in part, on the realization that displacement currents, body diode currents and avalanche breakdown currents can also generate electric fields that may further stress the gate oxide layers of a power semiconductor device. In an n-type power semiconductor device, the p-type regions that extend the most deeply into the semiconductor layer structure will act as the primary path for displacement, body diode and avalanche breakdown currents. By having at least portions of the trench shield connection patterns extend deeper into the semiconductor layer structure than the trench shields, the deep portions of the trench shield connection patterns will act as the primary current paths for the displacement, body diode and avalanche breakdown currents, routing these currents farther away from the channel regions of the device. Since the deep trench shield connection patterns tend to shield the gate oxide layers adjacent thereto from high electric fields during reverse blocking operation, the portions of the gate oxide layers that are adjacent the deep trench shield connection patterns may be less stressed during reverse blocking operation than the portions of the gate oxide layers adjacent the channel regions, and hence experience less damage. Thus, these portions of the gate oxide layers may be better capable of handling the electric field stress generated by any displacement, body diode and avalanche breakdown currents. Thus, the provision of deep trench shield connection patterns may improve the overall reliability of a power semiconductor device.

The spacing between adjacent deep trench shield connection patterns may be selected based on a tradeoff between the power handling capability and reliability of the device. If adjacent deep trench shield connection patterns are located close together, then the deep trench shield connection patterns may be very effective in shielding the trench shields and the gate oxide layers in the gate trenches from high electric field levels during reverse blocking operation, and may also ensure that any displacement, body diode and avalanche breakdown currents are primarily routed through the deep trench shield connection patterns as opposed to through the trench shields. However, since the deep trench shield connection patterns are inactive (i.e., current does not flow through the deep trench shield connection patterns during on-state operation), the more deep trench shield connection patterns included per unit area of a device the more the current handling capabilities of the device are reduced. Thus, a designer may select the pitch of the deep trench shield connection patterns based on a desired tradeoff between protecting the gate oxide layers from high electric fields and the on-state current carrying capabilities of the device. In example embodiments, the center-to-center distance between adjacent deep trench shield connection patterns may be between 1 micron and 100 microns. In more specific embodiments, the center-to-center distance between adjacent deep trench shield connection patterns may be between 2 microns and 30 microns, between 3 microns and 10 microns, or between 1 micron and 20 microns.

The inclusion of deep trench shield connection patterns in the semiconductor layer structure may eliminate the need for any support shields, such as the support shields 52 included in power MOSFET 1. As a result, the cell pitch of the power semiconductor devices according to embodiments of the present invention may be reduced as compared to power MOSFET 1, allowing the power MOSFETs according to embodiments of the present invention to support higher on-state currents and block higher voltages in the reverse blocking state.

In some embodiments, the gate trenches may have longitudinal axes that extend in a first direction in the semiconductor layer structure, and trench shields may be disposed underneath each gate trench. The trench shield connection patterns may have longitudinal axes that extend in a second direction that crosses the first direction. For example, the second direction may be perpendicular to the first direction. In some embodiments, the trench shield connection patterns may be formed as continuous stripes of material that cross many or even all of the gate trenches. In other embodiments, the trench shield connection patterns may only cross a small number of gate trenches, or even a single gate trench.

In some embodiments, the trench shield connection patterns may be formed after the gate trenches are formed. In such embodiments, each trench shield connection pattern may have one or more second portions, where each second portion is below and vertically overlapping a respective one of the gate trenches, and one or more first portions, where each first portion is in between a respective pair of the gate trenches. The first portions may extend to the upper surface of the semiconductor layer structure. The second portions may extend deeper into the semiconductor layer structure than the first portions and/or the trench shields.

Embodiments of the present invention will now be described in more detail with reference to FIGS. 3A-11. It will be appreciated that features of the different embodiments disclosed herein may be combined in any way to provide many additional embodiments. Thus, it will be appreciated that various features of the present invention are described below with respect to specific examples, but that these features may be added to other embodiments and/or used in place of example features of other embodiments to provide many additional embodiments. Thus, the present invention should be understood to encompass these different combinations. Additionally, while the example embodiments focus on MOSFET implementations, it will be appreciated that the same techniques may be used in other gate trench power semiconductor devices such as insulated gate bipolar transistors (IGBTs), gate controlled thyristors and the like.

Figure 3A:
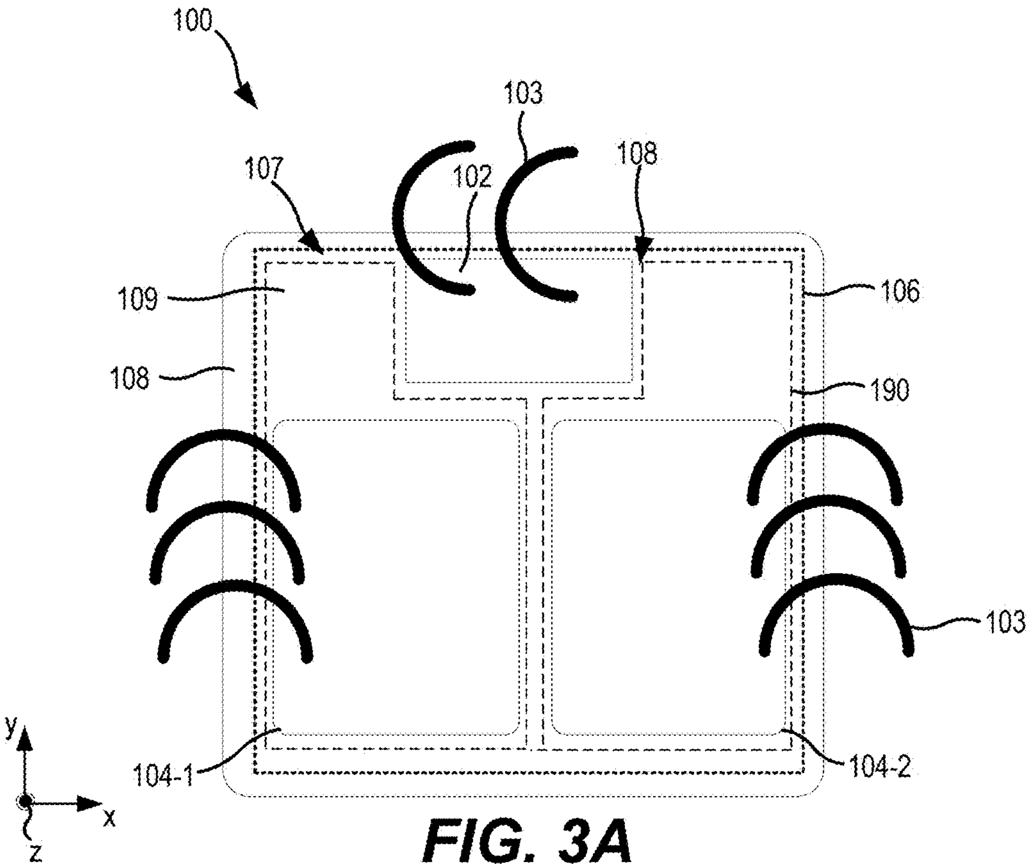
FIG. 3A is a schematic top view of a gate trench silicon carbide power MOSFET according to certain embodiments of the present invention.
Figure 3B:
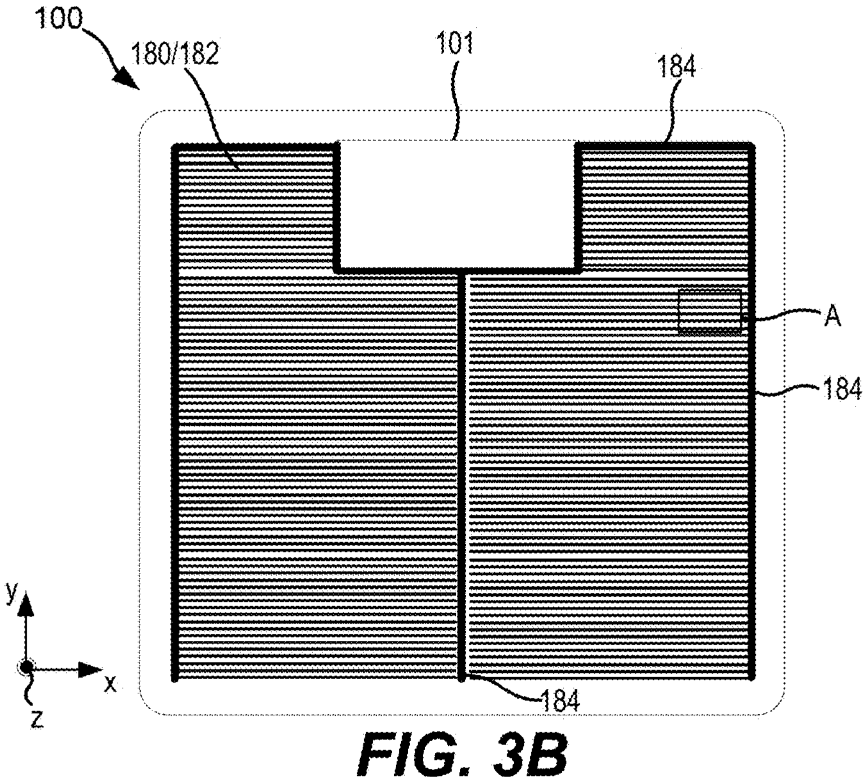
FIG. 3B is a schematic top view of the gate trench silicon carbide power MOSFET of FIG. 3A with various of the upper metal and dielectric layers removed.

FIG. 3A is a schematic top view of a gate trench silicon carbide power MOSFET 100 according to certain embodiments of the present invention. FIG. 3B is a schematic plan view of the power MOSFET 100 with various top-side metal and dielectric layers thereof omitted to show the gate electrodes and gate buses.

The power MOSFET 100 includes a semiconductor layer structure 160 (see FIGS. 3D-3H) that comprises a plurality of semiconductor layers/regions. At least one of the semiconductor layers in the semiconductor layer structure 160 may be a silicon carbide layer. Various metal and/or dielectric layers are formed on either side of the semiconductor layer structure 160 and embedded in the semiconductor layer structure 160.

As shown in FIG. 3A, the top-side metal layers include a gate bond pad 102 and one or more source bond pads 104-1, 104-2 that are formed on the upper side of the semiconductor layer structure 160. A metal drain pad 106 (shown as a dotted box in FIG. 3A) is provided on the bottom side of the semiconductor layer structure 160. The gate bond pad 102, the source bond pads 104 and the drain pad 106 form the respective gate, source and drain terminals of power MOSFET 100. The gate and source pads 102, 104 may each be formed of a metal, such as aluminum, that bond wires can be readily attached to via conventional techniques such as thermo-compression or soldering. The drain pad 106 may likewise be a metal pad. A protective layer 109 such as a polyimide layer may cover the entire upper surface of power MOSFET 100 except for the gate and source pads 102, 104.

Still referring to FIG. 3A, the power MOSFET 100 includes a source metallization layer 190 (indicated by the dashed boxes in FIG. 3A) that electrically connects certain regions of the semiconductor layer structure 160 to the source bond pads 104-1, 104-2. The source bond pads 104-1, 104-2 may be portions of the source metallization layer 190 that are exposed through openings in the protective layer 109 or may be separate metal layers. The source metallization layer 190 may generally overlie or correspond to an "active region" 107 of the power MOSFET 100 where the unit cell transistors are located. An inactive region 108 of power MOSFET 100 surrounds the active region 107. The inactive region 108 may include a termination region that extends around the periphery of the MOSFET 100 that includes guard rings, junction termination elements or other termination structures (not shown), a gate pad region that underlies the gate pad 102, and gate bus regions (discussed below).

Bond wires 103 are shown in FIG. 3A that may be used to connect the gate bond pad 102 and the source bond pads 104 to external circuits or the like. The drain pad 106 on the bottom side of power MOSFET 100 may be connected to an external circuit through, for example, an underlying submount (not shown).

FIG. 3B is another plan view of power MOSFET 100 with the gate and source bond pads 102, 104, the polymide layer 109, the source metallization layer 190, the intermetal dielectric layers 172 and various other metal and dielectric layers removed to show the gate electrodes 182 that are formed in the gate trenches 180 in the semiconductor layer structure 160. A patterned field oxide layer (not shown) is formed on the semiconductor layer structure 160 in the inactive region 108 of the MOSFET 100. The field oxide layer may be a relatively thick oxide layer (e.g., ten to twenty times thicker than the gate oxide layers that are discussed below). A polysilicon layer 101 may be formed on the field oxide layer and may be formed in the region where the gate bond pad 102 is formed so that the gate bond pad 102 vertically overlaps the field oxide layer and the polysilicon layer 101. As used herein, two elements of a semiconductor device are considered to "vertically overlap" if an axis that is perpendicular to the major surfaces of a semiconductor layer structure of the semiconductor device intersects both elements.

One or more gate buses 184 are provided that extend around much of the periphery of the active region 107. The field oxide layer typically runs underneath each gate bus 184 as well as underlying the gate bond pad 102. The gate buses 184 are electrically connected to the gate bond pad 102, often through gate resistors (not shown). A plurality of gate trenches 180 are formed throughout the active region 107. A gate electrode 182 is formed in each gate trench 180. In the depicted MOSFET 100, the gate electrodes 182 extend horizontally across the semiconductor layer structure 160. In other cases, the gate electrodes 182 may extend vertically across the semiconductor layer structure 160, or both horizontally-extending and vertically-extending gate electrodes 182 can be provided to form a grid-like gate electrode structure. The gate electrodes 182 may be connected to the gate pad 102 through the gate buses 184. The gate electrodes 182 may comprise, for example, a doped polysilicon or metal pattern. The gate buses 184 may comprise polysilicon, silicide and/or metal structures in example embodiments and typically are in the inactive region 108 of power MOSFET 100.

Figure 3C:
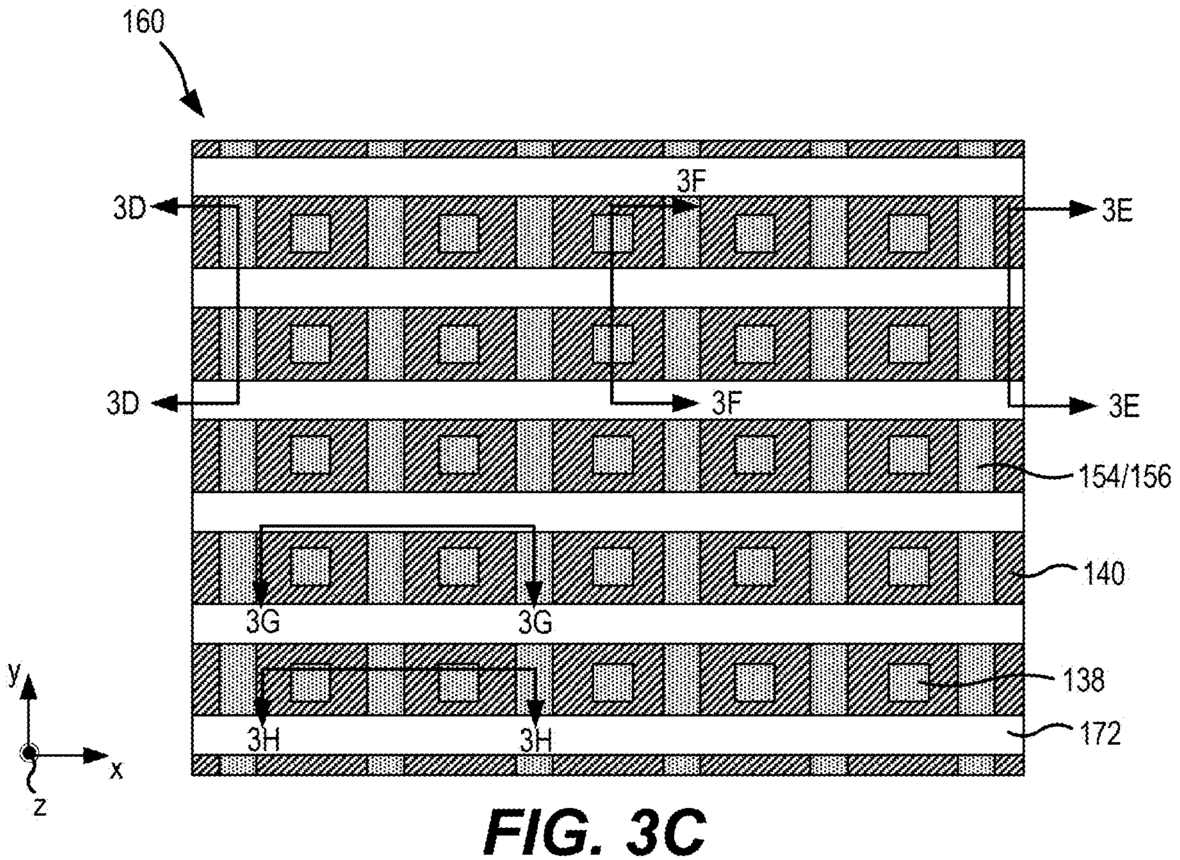
FIG. 3C is a schematic top view of the portion of the power MOSFET of FIG. 3B shown in the box labelled A in FIG. 3B.

FIG. 3C is a schematic top view of the portion of the power MOSFET 100 of FIG. 3B shown in the box labelled A in FIG. 3B. FIGS. 3D-3H are schematic cross-sectional views of the gate trench silicon carbide power MOSFET of FIGS. 3A-3C that are taken along lines 3D-3D, 3E-3E, 3F-3F, 3G-3G and 3H-3H, respectively, of FIG. 3A. Note that FIGS. 3D-3H illustrate the source metallization layer 190 for context, even though the source metallization layer 190 is omitted in FIGS. 3B-3C. It will be appreciated that the thicknesses of various of the layers and regions in FIGS. 3C-3H are not necessarily drawn to scale. The same is true with respect to the other figures included in this application.

Referring to FIGS. 3C-3H, the power MOSFET 100 includes an n-type silicon carbide semiconductor substrate 110. The substrate 110 may comprise, for example, a single crystal 4H silicon carbide semiconductor substrate that is heavily-doped with n-type impurities (i.e., an $n^+$ silicon carbide substrate). The impurities may comprise, for example, nitrogen or phosphorous. In example embodiments, the n-type substrate 110 may have a doping concentration of, for example, between $1\times10^{18}$ atoms/cm$^3$ and $1\times10^{21}$ atoms/cm$^3$, although other doping concentrations may be used. The substrate 110 may be relatively thick in some embodiments (e.g., 20-100 microns or more). The substrate 110 may be partially or fully removed in some embodiments. It should be noted that while the substrate 110 is depicted as a relatively thin layer, this is done to allow enlarging the thickness of other layers and regions in FIG. 3C, and it will be appreciated that the substrate 110 will typically be much thicker than shown.

A lightly-doped n-type (n−) silicon carbide drift layer 120 (which also may be referred to herein as a drift region 120) is provided on an upper surface of the substrate 110. Typically, the drift layer 120 is formed via an epitaxial growth process and is doped during growth. The n-type drift region 120 may have, for example, a doping concentration of $1\times10^{14}$ to $5\times10^{17}$ dopants/cm$^3$. The n-type drift region 120 may be a thick region, having a vertical height above the substrate 110 of, for example, 3-50 microns. An upper portion of the n-type drift region 120 may comprise a plurality of n-type JFET regions 122 that are more heavily doped than the lower portion of the n-type drift region 120. The n-type JFET regions 122 may have an n-type dopant concentration of, for example, $1\times10^{16}$ to $1\times10^{18}$. The n-type JFET regions 122 are considered to be part of the drift region 120.

The drift layer 120 and the substrate 110 together act as a common drain region for the power MOSFET 100. The drain pad 106 is formed on the substrate 110 opposite the drift region 120.

Figure 3D:
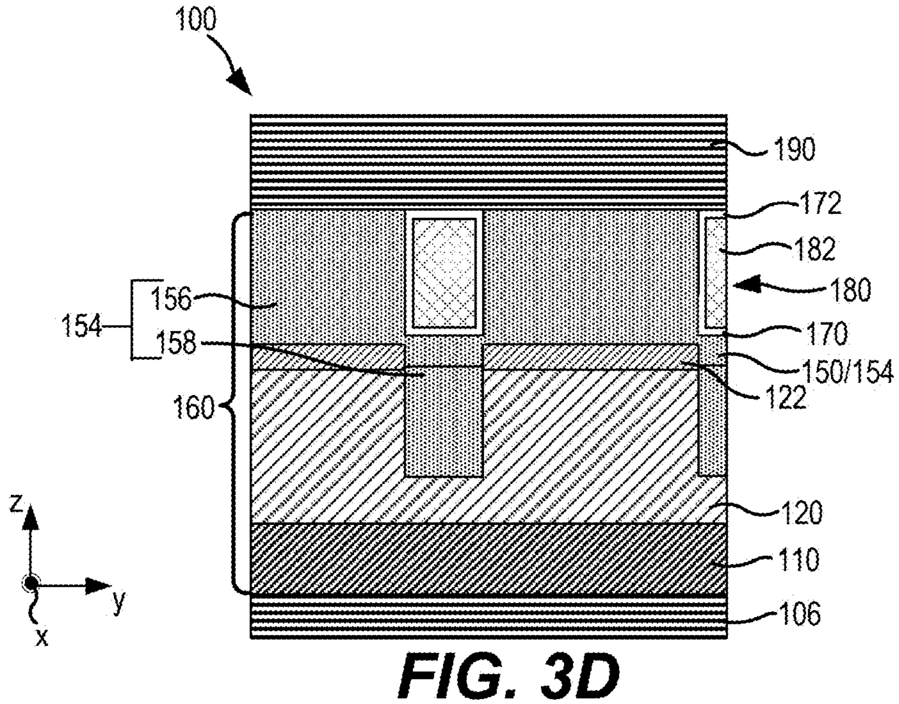
FIGS. 3D-3H are schematic cross-sectional views of the gate trench silicon carbide power MOSFET of FIGS. 3A-3C that are taken along lines 3D-3D, 3E-3E, 3F-3F, 3G-3G and 3H-3H, respectively, of FIG. 3C.
Figure 3E:
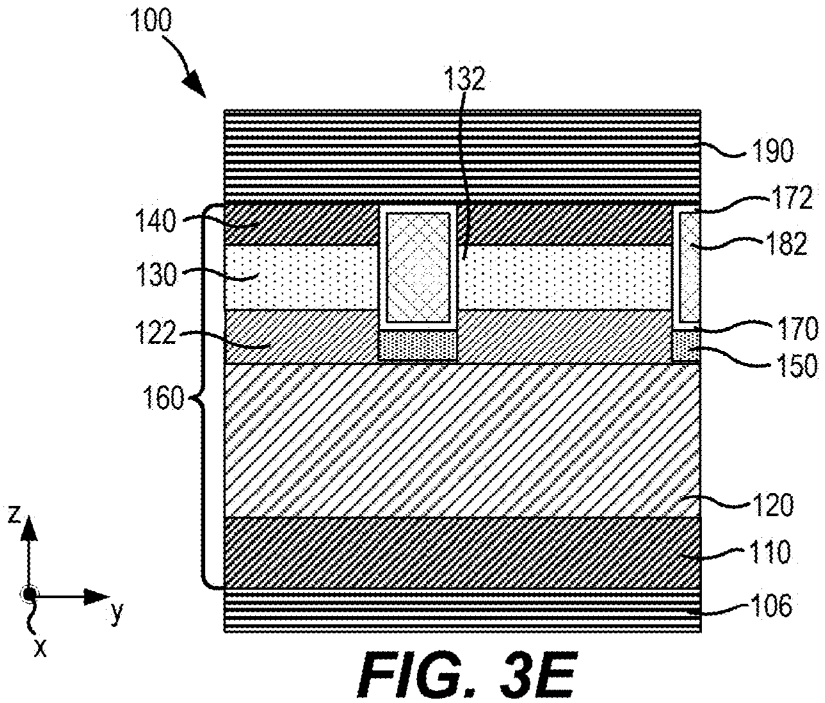
Figure 3F:
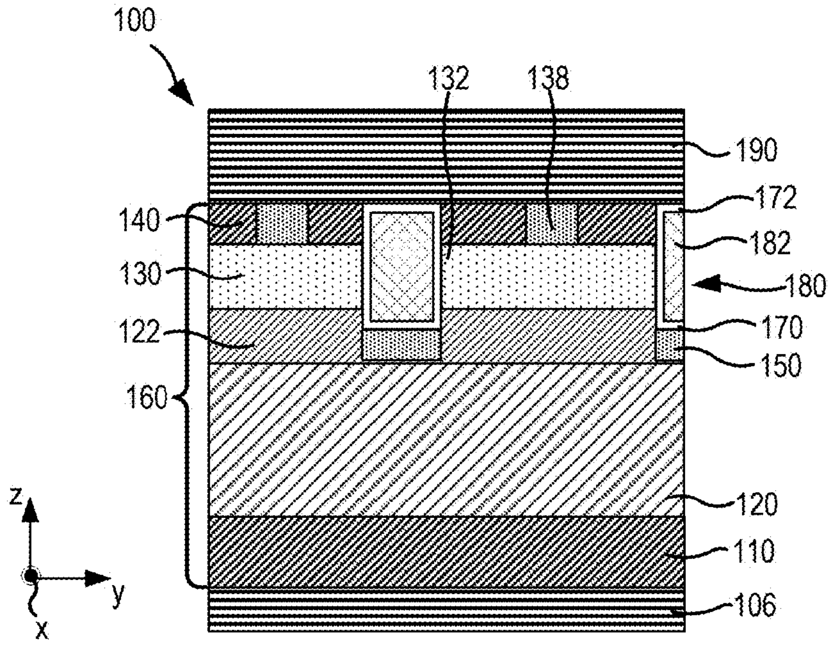
Figure 3G:
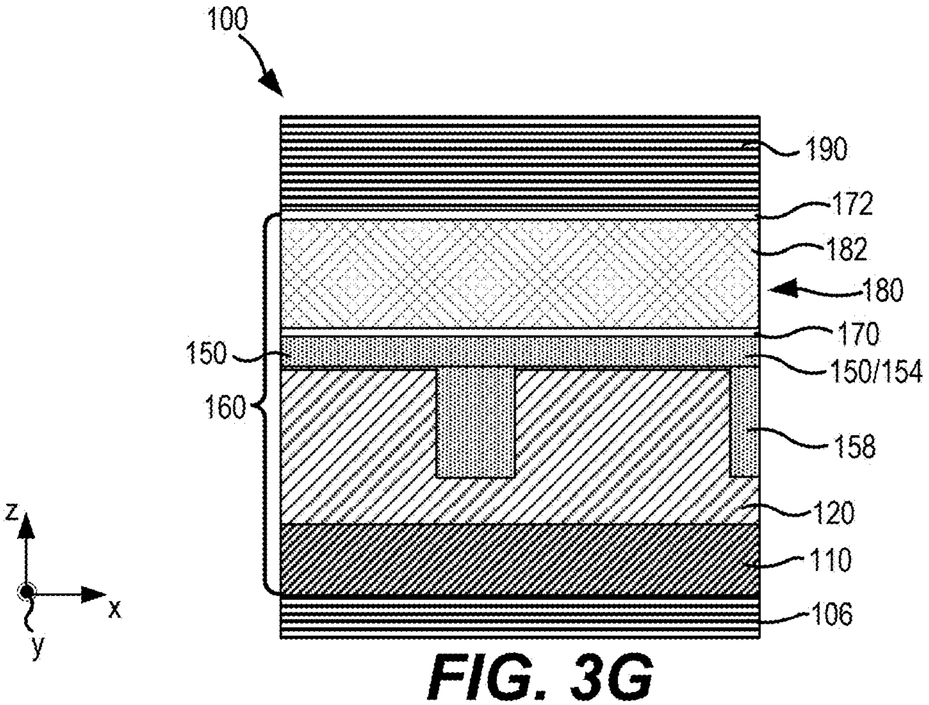
Figure 3H:
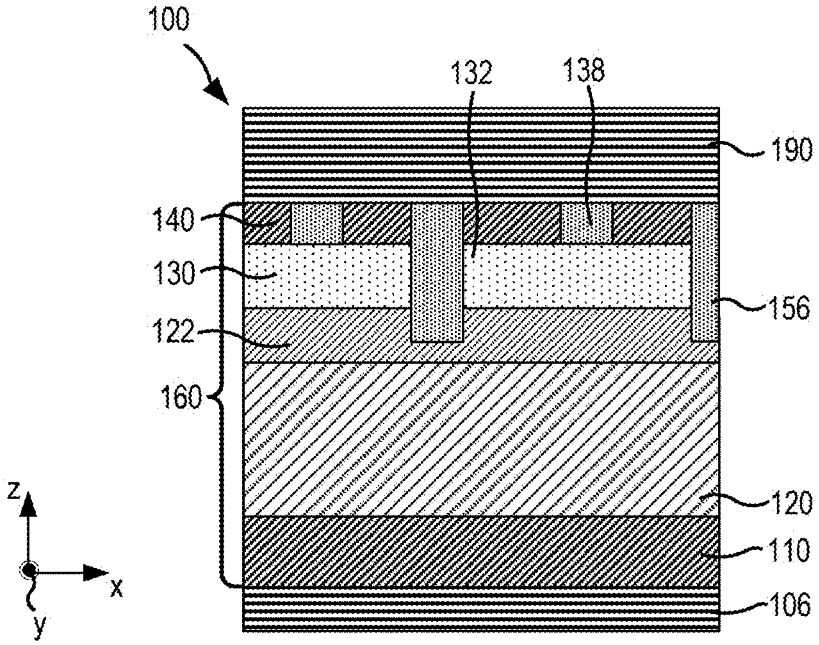

As shown in FIGS. 3E-3F and 3H, a plurality of moderately-doped (p) p-type silicon carbide well regions 130 (which may also be referred to herein as a "p-wells 130") are formed on the upper surfaces of the respective n-type JFET regions 122. The moderately-doped (p) p-type silicon carbide well regions 130 may be formed either by epitaxial growth or by implanting p-type dopant ions into the upper portion of the n-type drift region 120 to convert the upper portion of the n-type drift layer 120 into the p-type silicon carbide well regions 130. The p-wells 130 may have doping concentrations of, for example, between $5\times10^{15}$ cm$^{-3}$ and $5\times10^{19}$ cm$^{-3}$ and, more typically, between $5\times10^{16}$ cm$^{-3}$ and $5\times10^{19}$ cm$^{-3}$. Channel regions 132 are provided in upper side portions of the p-wells 130.

A plurality of heavily-doped n-type (n+) silicon carbide source regions 140 are formed on upper portions of the respective p-wells 130. The heavily-doped n-type silicon carbide source regions 140 may be formed by ion implantation. The source regions 140 may have doping concentrations of, for example, between $5\times10^{12}$ cm$^{-3}$ and $5\times10^{21}$ cm$^{-3}$. In addition, heavily-doped p-type silicon carbide well contact regions 138 are also formed on upper portions of the p-wells 130 adjacent the source regions 140. The well contact regions 138 may appear as a plurality of "islands" in the source regions 140 when the MOSFET 100 is viewed in plan view, as shown in FIG. 3C. In other embodiments, the well contact regions 138 may extend as stripes in the x-direction, or may have other configurations.

As discussed above, a plurality of gate trenches 180 are formed in the upper surface of the semiconductor layer structure 160. Longitudinal axes of the gate trenches 180 extend in parallel to each other in the x-direction. P-type trench shields 150 are formed underneath the respective gate trenches 180 and may extend underneath the respective gate trenches 180 for all or substantially all of the length of each gate trench 180. The p-type trench shields 150 may be moderately or heavily doped ($p^+$) silicon carbide regions. For example, each p-type trench shield 150 may have a doping concentration between about $1\times10^{17}$ and $1\times10^{21}$. In other embodiments, each p-type trench shield 150 may have a doping concentration between about $1\times10^{18}$ and $1\times10^{20}$, between about $1\times10^{19}$ and $1\times10^{20}$, between about $1\times10^{17}$ and $1\times10^{20}$, or between about $1\times10^{18}$ and $1\times10^{21}$. In example embodiments, each p-type trench shield 150 may extend to a depth of between 0.5 and 3.0 microns from the upper surface of the semiconductor layer structure 160. In other embodiments, the depth of each p-type trench shield 150 may be between 1.0 and 3.0 microns, between 1.0 and 2.5 microns, between 1.5 and 3.0 microns, between 1.5 and 2.5 microns, or between 0.5 and 2.5 microns. Typically, each trench shield 150 will extend to the same depth into the semiconductor layer structure 160 along its entire length and all of the trench shields 150 will extend to the same depth into the semiconductor layer structure 160. Any of the above dopant concentrations may be matched with any of the above-listed depths for the p-type trench shields 150. The p-type trench shields 150 may act to reduce the electric field levels that form in gate oxide layers during device operation, as will be discussed in greater detail below.

As shown in FIG. 3C, a plurality of p-type trench shield connection patterns 154 are formed in the semiconductor layer structure 160. The trench shield connection patterns 154 electrically connect the p-type trench shields 150 to the source metallization layer 190. Each p-type trench shield connection pattern 154 may have a doping concentration between about $1\times10^{17}$ and $1\times10^{21}$. In other embodiments, each p-type trench shield connection pattern 154 may have a doping concentration between about $1\times10^{18}$ and $1\times10^{20}$, between about $1\times10^{19}$ and $1\times10^{20}$, between about $1\times10^{17}$ and $1\times10^{20}$, or between about $1\times10^{18}$ and $1\times10^{21}$. The trench shield connection patterns 154 may have the same or different doping concentrations than the trench shields 150. The trench shield connection patterns 154 extend as parallel stripes in the upper surface of the semiconductor layer structure and cross the gate trenches 180. In the embodiment of FIG. 3C, the longitudinal axes of the trench shield connection patterns 154 extend in the y-direction perpendicular to the longitudinal axes of the gate trenches 180.

The substrate 110, the drift region 120 (including the JFET regions 122), the p-wells 130 (including the channel regions 132) the well contact regions 138, the source regions 140, the trench shields 150 and the trench shield connection patterns 154 together comprise the semiconductor layer structure 160 of MOSFET 100.

As noted above, a plurality of gate trenches 180 are formed in the upper portion of the semiconductor layer structure 160. While only one full gate trench 180 and a portion of a second gate trench 180 are shown in the cross-sections of FIGS. 3D-3F, it will be appreciated from FIG. 3B that the MOSFET 100 may include a large number of gate trenches 180. Each gate trench 180 may extend along a longitudinal axis through the semiconductor layer structure 160, and the gate trenches 180 may extend in parallel to each other as shown best in FIGS. 3B-3C. The gate trenches 180 may be formed via an etching process.

A gate oxide layer 170 is provided in each gate trench 180 to cover the sidewalls and bottom surface of the gate trench 180. Each gate oxide layer 170 may comprise, for example, a silicon oxide ($SiO_2$) pattern. The gate oxide layers 170 may be formed generally conformally within the respective gate trenches 180.

A gate electrode 182 is formed in each gate trench 180 on the gate oxide layer 170. The gate electrodes 182 may comprise conductive material such as a silicide (e.g., NiSi, TiSi, WSi, CoSi), doped polycrystalline silicon (poly-Si), and/or a stable conductor. Other suitable materials for the gate electrode include various metals such as Ti, Ta or W or metal nitrides such as TiN, TaN or WN. The gate oxide layers 170 may insulate the gate electrodes 182 from the semiconductor layer structure 160, thereby preventing the gate electrodes 182 from short circuiting to the semiconductor layer structure 160. Each gate electrode 182 may connect to one of the gate buses 184 (see FIG. 3B). In the depicted embodiment, the gate electrodes 182 are recessed so that the upper surface of each gate electrode 182 is below an upper surface of the semiconductor layer structure 160. It will be appreciated that in other embodiments the gate electrodes 182 may extend above and onto the upper surface of the semiconductor layer structure 160, with the gate oxide layer 170 insulating the gate electrodes 182 from the upper surface of the semiconductor layer structure 160.

Intermetal dielectric layers 172 are formed that cover each gate electrode 182. The intermetal dielectric layers 170 insulate the source metallization layer 190 from the gate electrodes 182.

The source metallization layer 190 is formed on the upper surface of the semiconductor layer structure 160 and on the intermetal dielectric layers 172. Herein, the source metallization layer 190 may also be referred to as the "source contact." The source metallization layer 190 may comprise a single metal layer or multiple metal layers. Typically multiple metal layers are provided, as the source metallization layer 190 may include a single layer or multi-layer adhesion layer that contacts the semiconductor layer structure 160, one or more barrier layers, and a bulk metal layer (e.g., an aluminum layer).

Power MOSFET 100 includes a unique trench shield connection pattern 154 design. In particular, the trench shield connection patterns 154 are "deep" trench shield connection patterns 154 that extend deeper into the semiconductor layer structure 160 than the trench shields 150. In the depicted embodiment, each trench shield connection pattern 154 extends as a stripe in the semiconductor layer structure 160.

The trench shield connection patterns 154 may be formed by ion implantation. In some embodiments, the trench shield connection patterns 154 may be formed by ion implantation after the gate trenches 180 are formed. This may be accomplished by forming an ion implantation mask (not shown) over the upper surface of the semiconductor layer structure 160 after the gate trenches 180 have been formed, and then patterning the mask to expose a plurality of continuous stripes along the upper surface of the semiconductor layer structure 160. These stripes extend in the y-direction of FIG. 3C, and are positioned in the locations of the trench shield connection patterns 154 in FIG. 3C. An ion implantation process is then performed to implant p-type ions into the exposed portions of the upper surface of the semiconductor layer structure 160 and into the exposed portions of the bottom surfaces of the gate trenches 180. As shown in FIG. 3D, the ion implantation step forms a plurality of stripes of p-type material in the upper surface of the semiconductor layer structure 160, where each stripe is a respective trench shield connection pattern 154. Each trench shield connection pattern 154 has a plurality of first portions 156 that are each formed in between a respective pair of adjacent gate trenches 180, and a plurality of second portions 158 that are formed underneath the respective gate trenches 180. The second portions 158 extend deeper into the semiconductor layer structure 160 than the first portions 156 since the p-type ions forming the second portions 158 are implanted into the bottoms of the respective gate trenches 180. The second portions 158 may extend deeper into the semiconductor layer structure 160 than the first portions 156 by the depth of the gate trenches 180. The first portions 156 may extend to the upper surface of the semiconductor layer structure 160. The first portions 156 are formed to extend deeper into the semiconductor layer structure 160 than the gate trenches 180 so that the first portions and second portions 158 are physically and electrically connected to each other.

As shown in FIGS. 3D-3F, the p-type trench shields 150 are formed to extend underneath the respective gate trenches 180. The p-type trench shields 150 may be formed by implanting p-type dopants into the bottom surfaces of the gate trenches 180. The trench shield connection patterns 154 may be formed using a higher energy ion implantation process than is used to form the trench shields 150. Consequently, the second portions 158 of the p-type trench shield connection patterns 154 may extend through the trench shields 150 and deeper into the semiconductor layer structure 160 than the p-type trench shields 150. The upper portions of the second portions 158 of the trench shield connection patterns 154 thus may be formed in the trench shields 150. As shown, in some embodiments, the first portions 156 of the p-type trench shield connection patterns 154 may not extend as far into the semiconductor layer structure 160 as the p-type trench shields 150. In other embodiments, the first portions 156 of the p-type trench shield connection patterns 154 may extend to the same depth as the p-type trench shields 150 into the semiconductor layer structure 160 or may extend deeper into the semiconductor layer structure 160 than the p-type trench shields 150.

Referring to FIG. 3D, since the first portions 156 of the p-type trench shield connection patterns 154 extend along the entire sidewalls of the gate trenches 180, the trench shield connection patterns 154 will not act as channel regions, since only p-type material overlies horizontally overlaps the gate electrodes 182. Thus, each trench shield connection pattern 154 forms a stripe of inactive area within the active region 107 of MOSFET 100.

Referring to FIG. 3G, it can be seen that a respective second portion 158 of each of the trench shield connection patterns 154 extends through and underneath each of the trench shields 150 at spaced-apart intervals. Each trench shield connection pattern 154 may be formed through the trench shields 150 (e.g., the trench shield connection pattern 154 may be formed through the trench shields so that an upper portion of the second portions 158 of the trench shield connection patterns 154 are collocated with respective portions of the trench shields 150) and hence is electrically connected to the trench shields 150. Since the second portions 158 of the trench shield connection patterns 154 extend significantly deeper into the semiconductor layer structure 160 than the trench shields 150, any displacement, body diode and/or avalanche breakdown currents that flow through the drift region 120 will flow along the edges of the second portions 158 of the trench shield connection patterns 154 to the source metallization layer 190. As discussed above, when displacement, body diode and/or avalanche breakdown currents flow through the MOSFET 100, electric fields are generated that can, over time, damage the gate oxide layers 170. Thus, these displacement, body diode and/or avalanche breakdown currents may stress the portions of the gate oxide layers 170 that line the portions of the gate trenches 180 that extend above the second portions 158 of the trench shield connection patterns 154. Notably, these portions of the gate oxide layers 170 are generally stressed less by electric fields during normal reverse blocking operation since the deep second portions 158 of the trench shield connection patterns 154 suppress the electric field levels. Thus, the portions of the gate oxide layers 170 that are stressed by the electric fields generated by the displacement, body diode and/or avalanche breakdown currents are the portions that are stressed less during reverse blocking operation, which has the effect of spreading the electric field stresses more evenly over the gate oxide layers, 170 which extends the time until oxide breakdown. Thus, the provision of deep trench shield connection patterns 154 may improve the overall reliability of power MOSFET 100 as compared to a conventional power MOSFET.

The power MOSFET 100 may be turned on by applying a gate bias voltage that is above a threshold level to the gate pad 102. The gate bias voltage is transferred to the gate electrodes 182 via the gate buses 184 and creates conductive n-type inversion layers in the portions of the silicon carbide p-wells 130 that are adjacent the gate trenches 180. These regions of the p-wells 130 are referred to herein as channel regions 132 (or "channels") as current flows from the source layer 140 to the drift region 120 through these channel regions 132 during on-state operation. The channel regions 132 are vertically oriented (i.e., extend in the z direction) as the current flows downwardly from the source layer 140, through the channel regions 132 to the drift region 120, substrate 110 and drain contact 106.

As discussed above with respect to FIG. 2, conventional n-type power MOSFET 1 includes p-type support shields 52 that extend as stripes in the semiconductor layer structure 60, with each p-type support shield 52 extending between a pair of adjacent gate trenches 80 and extending parallel to the gate trenches 80. The p-type support shields 52 act to suppress the electric field values during reverse blocking operation, which can help reduce the electric field levels in the lower corners of the gate oxide layers 70 during reverse blocking operation. Unfortunately, however, the distance between adjacent gate trenches 80 generally needs to be increased to make room for the support shields 52. In power MOSFET 100, no support shields are provided, since the deep second portions 158 of the trench shield connection patterns 154 may provide a similar electric field blocking function while also serving as a path for displacement, body diode and avalanche breakdown currents. Consequently, the number of unit cell transistors per unit area can be increased in power MOSFET 100 as compared to power MOSFET 1, allowing power MOSFET 100 to support higher on-state currents and block higher off-state voltages.

Figure 3I:
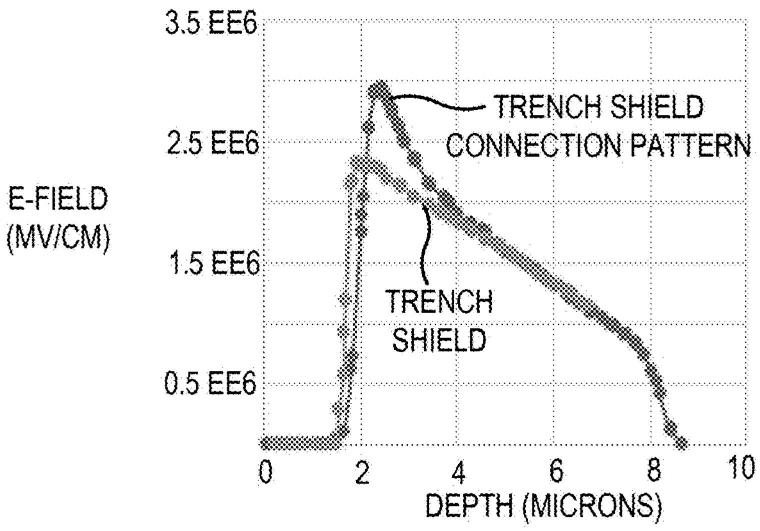
FIG. 3I is a graph illustrating the simulated relative electric field levels in the lowermost portion of the trench shield and the trench shield connection patterns during reverse blocking operation in the power MOSFET of FIGS. 3A-3H.

FIG. 3I is a graph illustrating the simulated relative electric field levels in the lowermost portion of the trench shields 150 and the trench shield connection patterns 154 during reverse blocking operation in the power MOSFET 100 of FIGS. 3A-3H. As shown in FIG. 3I, the peak electric field values in the trench shield connection patterns 154 are about 20% higher in the trench shield connection patterns 154 than in the trench shield 150. As discussed above with respect to FIG. 1, the damage to the gate oxide layer is exponential with respect to peak electric field values, and hence a 20% reduction in the peak electric field values may correspond to a significant improvement in device reliability. It will be appreciated that the 20% reduction in the peak electric field values discussed above is based on a device that includes a specific spacing between adjacent ones of the trench shield connection patterns 154. If the trench shield connection patterns 154 are spaced more closely together, the peak electric field values in the trench shields 150 may be more than 20% below the peak electric field values in the trench shield connection patterns 154. Conversely, if adjacent trench shield connection patterns 154 are spaced further apart, the peak electric field values in the trench shields 150 may be less than 20% below the peak electric field values in the trench shield connection patterns 154.

Referring again to FIGS. 3A-3H, pursuant to some embodiments of the present invention, semiconductor devices 100 are provided that comprise a semiconductor layer structure 160 that has a plurality of gate trenches 180 therein and a source metallization layer 190 on the semiconductor layer structure 160. The semiconductor layer structure 160 comprises a drift region 120 having a first conductivity type (e.g., n-type), a plurality of well regions 130 that have a second conductivity type (e.g., p-type) on the drift region 120, a plurality of trench shields 150 that have the second conductivity type, each trench shield 150 positioned underneath a respective one of the gate trenches 180, and a plurality of trench shield connection patterns 154 that have the second conductivity type, each trench shield connection pattern 154 electrically connecting at least one of the trench shields 150 to the source metallization layer 190, where the trench shield connection patterns 154 extend deeper into the semiconductor layer structure 160 than the trench shields 150. The semiconductor layer structure 160 may be a silicon carbide semiconductor layer structure 160 and the semiconductor device 100 may be a MOSFET.

Each trench shield connection pattern 154 may extend below and vertically overlap at least one of the trench shields 150. The gate trenches 180 extend in parallel to each other and the trench shields 150 extend longitudinally underneath the respective gate trenches 180, and a plurality of gate electrodes 182 are provided in the respective gate trenches. Each trench shield connection pattern 154 may cross below multiple of the gate trenches 180. Longitudinal axes of the gate trenches 180 extend in a first direction, and longitudinal axes of the trench shield connection patterns 154 may extend in a second direction that is, for example, perpendicular to the first direction.

Each trench shield connection pattern 154 includes a plurality of first portions 156 that are in between the gate trenches 180 and a plurality of second portions 158 that are underneath the gate trenches 180. The second portions 158 may extend deeper into the semiconductor layer structure 160 than the first portions 156. The first portions 156 may extend deeper into the semiconductor layer structure 160 than the gate trenches 180. The first portions 156 may extend to the upper surface of the semiconductor layer structure 160.

The semiconductor layer structure 160 further comprises a plurality of source regions 140 having the first conductivity type on the respective well regions 130 opposite the drift region 120. The semiconductor layer structure 160 further comprises a plurality of well contact regions 138 having the second conductivity type on the respective well regions 130 opposite the drift region 120, the well contact regions 138 having a doping concentration that is at least five times greater than a doping concentration of the well regions 130. The well contact regions 138 are arranged in a plurality of columns and rows when the semiconductor layer structure 160 is viewed in plan view, and each well contact region 138 is surrounded by a respective one of the source regions 140 when the semiconductor layer structure 160 is viewed in plan view. Each column of well contact regions 138 extends in between a respective pair of trench shield connection patterns 154.

Still referring to FIGS. 3A-3H, pursuant to other embodiments of the present invention, semiconductor devices such as silicon carbide based power MOSFET 100 are provided that comprise a semiconductor layer structure 160 that comprises a drift region 120 having a first conductivity type, a well region 130 having a second conductivity type positioned above the drift region 120, a trench shield 150 having the second conductivity type and has a longitudinal axis that extends in a first direction, and a trench shield connection pattern 154 that has the second conductivity type and has a longitudinal axis that extends in a second direction that is different than (e.g., perpendicular to) the first direction. At least a portion of the trench shield connection pattern 154 extends deeper into the semiconductor layer structure 160 than the trench shield 150, and may extend below and vertically overlaps the trench shield 150. The trench shield 150 may have a constant depth into the semiconductor layer structure 160.

In some embodiments, the semiconductor layer structure 160 has a plurality of gate trenches 180 therein that extend in the first direction, and the trench shield connection pattern 154 may be one of a plurality of trench shield connection patterns 154 that have the second conductivity type, and at least some of the trench shield connection patterns 154 may cross below multiple of the gate trenches 180. A first of the trench shield connection patterns 154 may include a first portion 156 that is in between first and second of the gate trenches 180 and a second portion 158 that extends underneath at least the first gate trench 180. The second portion 158 may extend further into the semiconductor layer structure 160 than the first portion 154, and the first portion 154 may extend to an upper surface of the semiconductor layer structure 160.

Still referring to FIGS. 3A-3H, pursuant to still further embodiments of the present invention, semiconductor devices such as silicon carbide based power MOSFET 100 are provided that comprise a semiconductor layer structure 160 that has a gate trench 180 therein, the gate trench 180 having a longitudinal axis that extends in a first direction. The semiconductor layer structure 160 comprises a drift region 120 having a first conductivity type, a trench shield 150 that has the second conductivity type extending underneath the gate trench 180, and a trench shield connection pattern 154 that has the second conductivity type, the trench shield connection pattern 154 including a first portion 156 that extends to an upper surface of the semiconductor layer structure 160 and a second portion 158 that extends through and underneath the trench shield 150.

Figure 4:
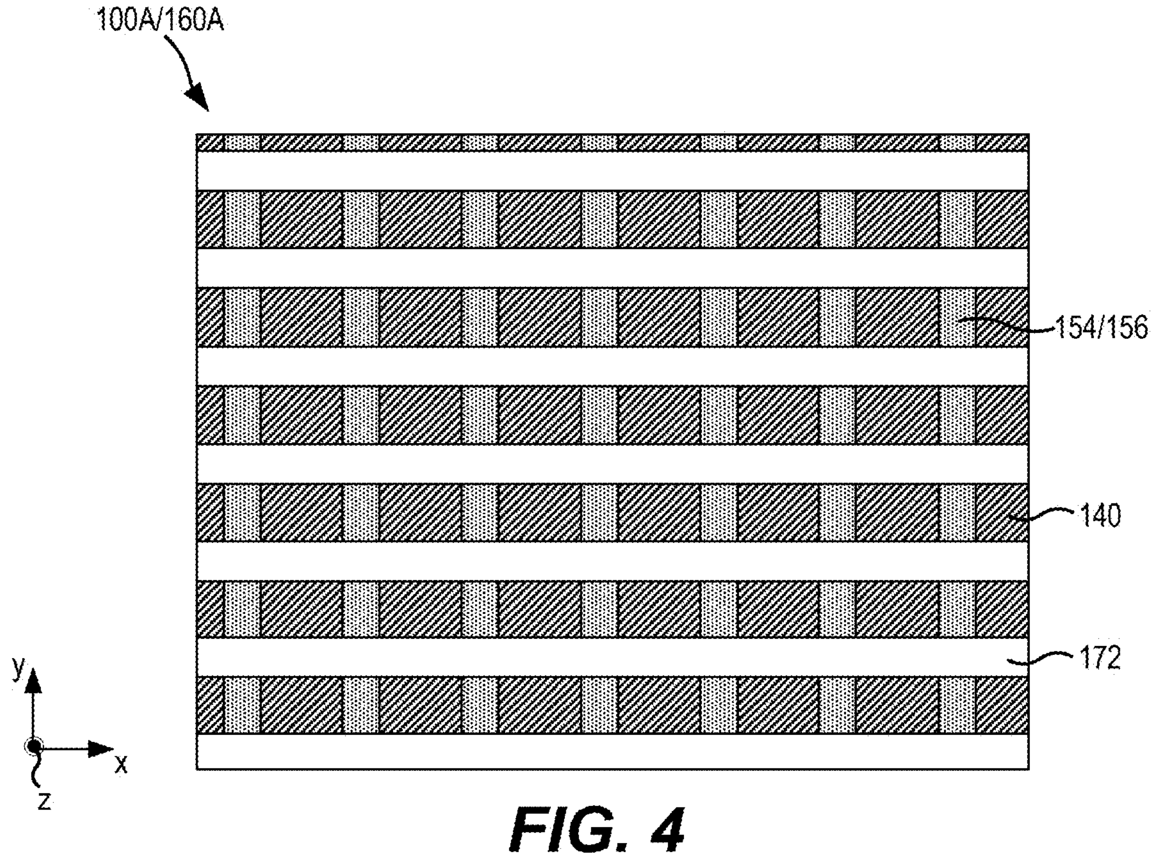
FIG. 4 is a schematic plan view that corresponds to FIG. 3C that illustrates a modified version of the power MOSFET of FIGS. 3A-3H.

FIG. 4 is a schematic plan view of a power MOSFET 100A that is a modified version of the power MOSFET 100 of FIGS. 3A-3H. FIG. 4 corresponds to the view of FIG. 3C (i.e., it illustrates the portion of the semiconductor layer structure 160A of power MOSFET 100A shown in the box labelled A of FIG. 3B).

As can be seen by comparing FIG. 3C and FIG. 4, the only differences between power MOSFET 100 and power MOSFET 100A is that (1) the well contact regions 138 of power MOSFET 100 are omitted in power MOSFET 100A, (2) the trench shield connection patterns 154 are spaced closer together in power MOSFET 100A and (3) the gate trenches 180 are spaced closer together. The well contact regions 138 of power MOSFET 100 may be omitted in power MOSFET 100A because the trench shield connection patterns 154 are highly doped p-type regions that extend to the upper surface of the semiconductor layer structure 160A and form ohmic contact with the source metallization layer 190, and also contact the p-wells 130. Thus, the trench shield connection patterns 154 may perform the function of the well contact regions 138 of power MOSFET 100 (namely providing a low-resistivity connection between the source metallization layer 190 and the p-wells 130). The trench shield connection patterns 154 may be spaced closer together in order to ensure that a sufficiently low-resistance contact is formed between the source metallization layer 190 and the p-wells 130. This may tend to increase the amount of inactive area within the active region 107, since no channel regions are provided where the trench shield connection patterns 154 abut the gate trenches 180. However, since the well contact regions 138 are omitted, the gate trenches 180 may potentially be spaced more closely together. In some cases this may more than compensate for the increase in the amount of inactive area within the active region 107. Thus, FIG. 4 illustrates how the well contact regions 138 may be omitted in some embodiments.

Figure 5A:
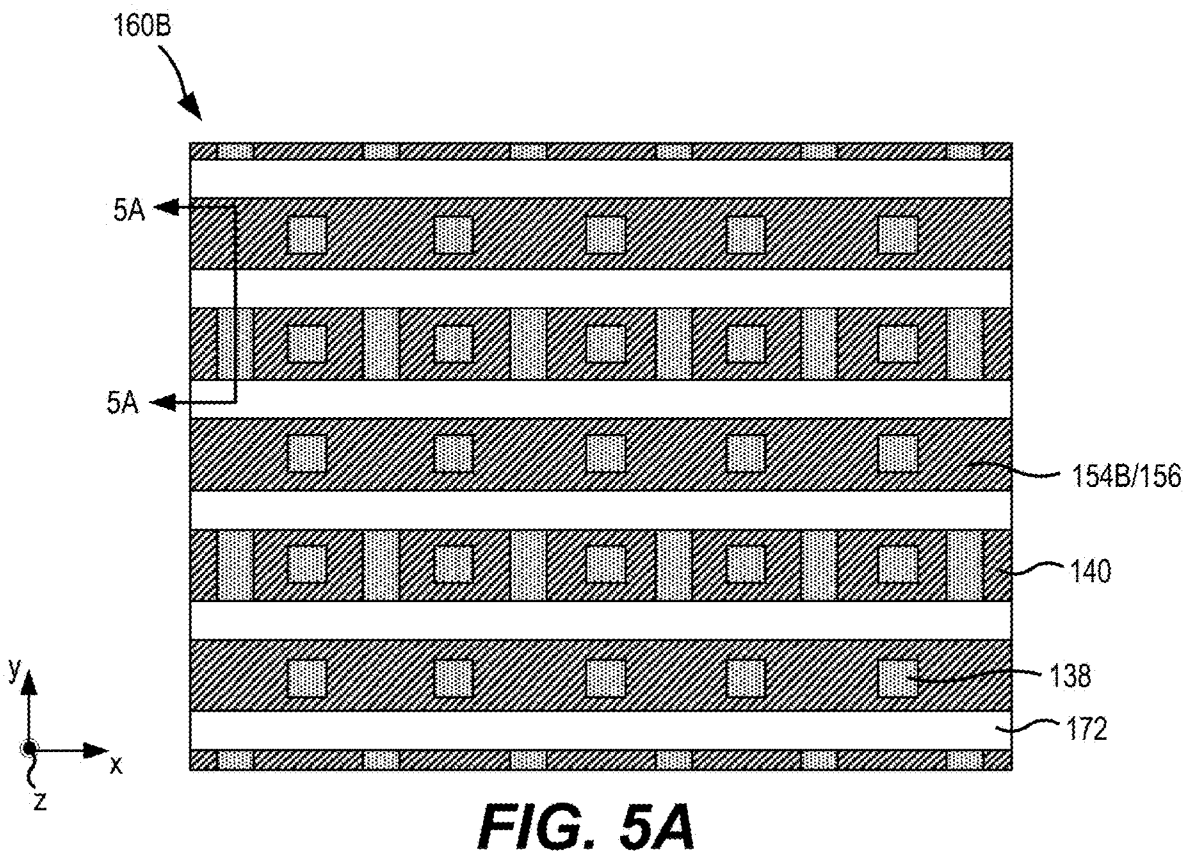
FIG. 5A is a schematic plan view that corresponds to FIG. 3C, that illustrates another modified version of the power MOSFET of FIGS. 3A-3H.
Figure 5B:
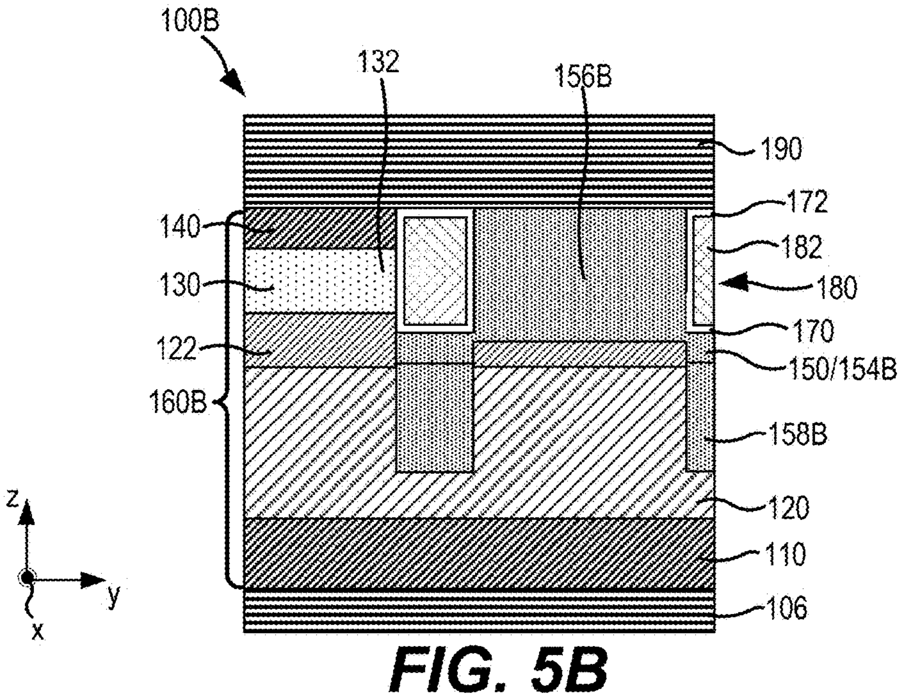
FIG. 5B is a schematic cross-sectional view of the power MOSFET of FIG. 5A that is taken along line 5B-5B of FIG. 5A.

FIG. 5A is a schematic plan view that corresponds to FIG. 3C, that illustrates a power MOSFET 100B that is another modified version of the power MOSFET 100 of FIGS. 3A-3H. FIG. 5B is a schematic cross-sectional view of the power MOSFET 100B of FIG. 5A that is taken along line 5B-5B of FIG. 5A. As can be seen by comparing FIGS. 3C-3D to FIGS. 5A-5B, power MOSFET 100B differs from power MOSFET 100 in that the trench shield connection patterns 154B of power MOSFET 100B are formed as discontinuous stripes that extend in the y-direction. As shown, in this embodiment, each trench shield connection pattern 154B includes a pair of second portions 158B that extend underneath a respective pair of gate trenches 180 and a first portion 156B that is positioned in between the two second portions 158B. The first portion 156B extends to the upper surface of the semiconductor layer structure 160 to electrically connect the two second portions 158B to one of the p-wells 130 and to the source metallization layer 190 (see FIG. 5B). A plurality of trench shield connection patterns 154B are aligned in the y-direction to form a discontinuous stripe of trench shield connection patterns 154B. As shown, the trench shield connection patterns 154B forming the discontinuous stripe may extend underneath every one of the gate trenches 180. A plurality of discontinuous stripes of trench shield connection patterns 154B are provided that extend in parallel to each other.

As shown in FIG. 5B, one advantage of the design of power MOSFET 100B is that a channel 132 is provided on one side of each gate electrode 182 along the full length of each gate electrode 182. This is possible because the trench shield connection patterns 154B are only provided on one side of each gate electrode 182. Thus, power MOSFET 100B may have an increased amount of channel area as compared to power MOSFET 100.

It will be appreciated that many modifications may be made to power MOSFET 100B. As one example, adjacent discontinuous stripes of trench shield connection patterns 154B may be offset (staggered) from each other when viewed in plan view. As another example, some or all of the trench shield connection patterns 154B may extend underneath more than two gate trenches 180 or underneath only a single gate trench 180.

Figure 6A:
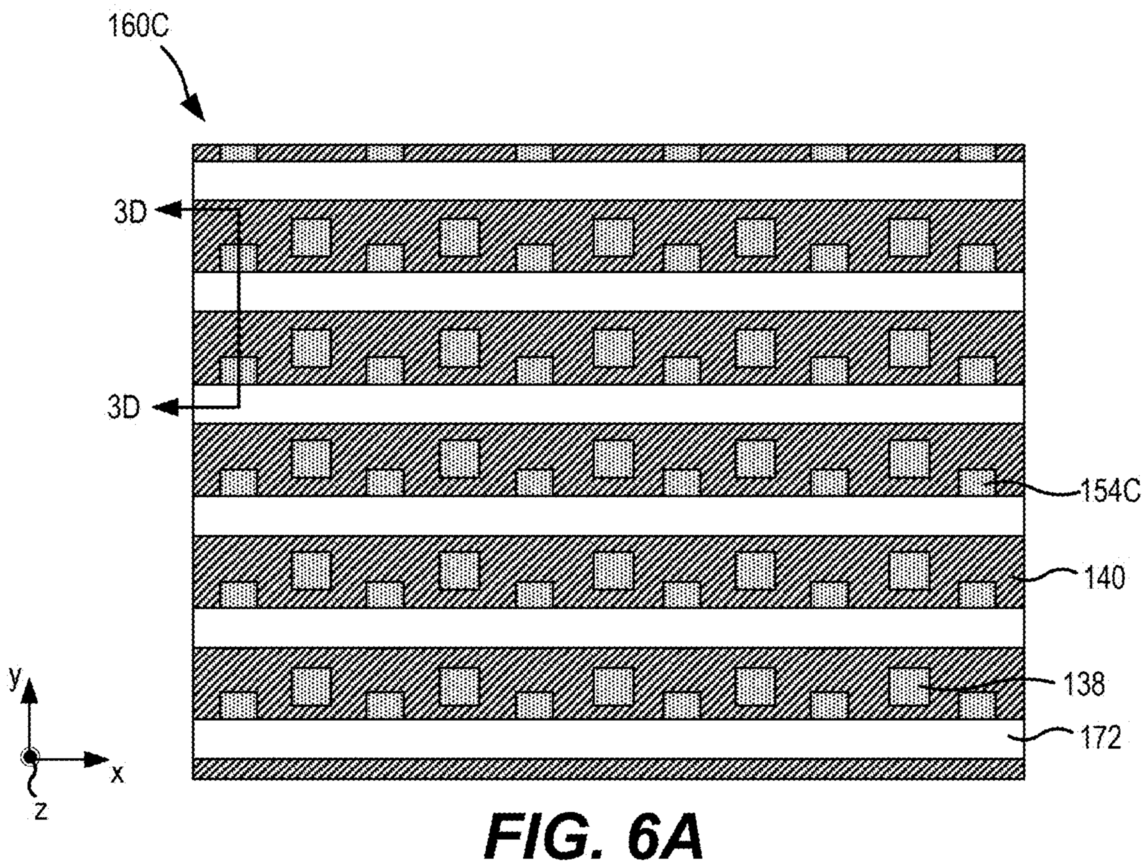
FIG. 6A is a schematic plan view that correspond to FIG. 3C, that illustrates yet another modified version of the power MOSFET of FIGS. 3A-3H.
Figure 6B:
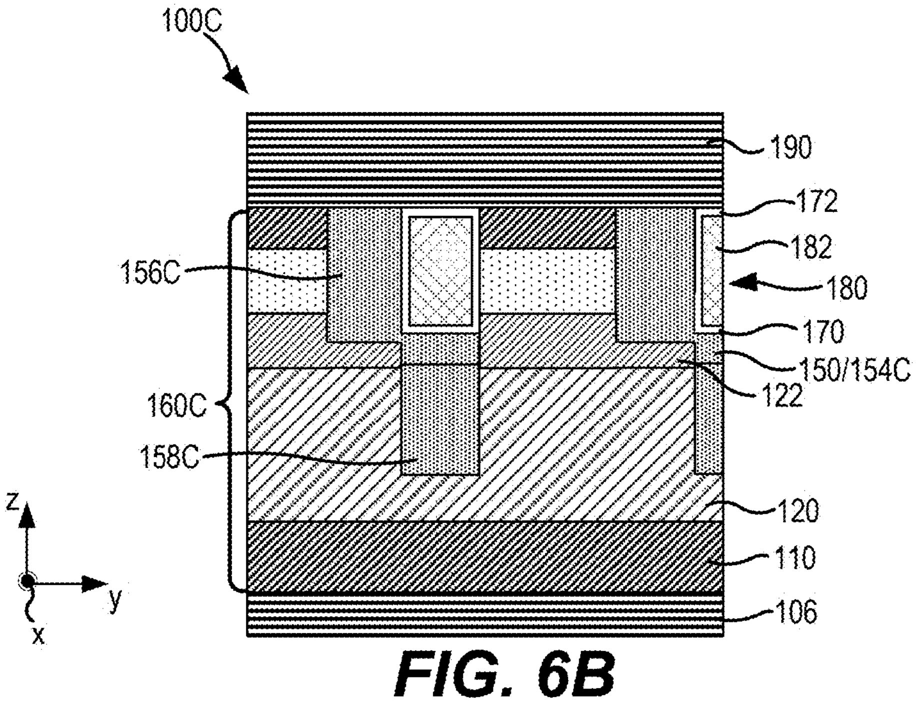
FIG. 6B is a schematic cross-sectional view of the power MOSFET of FIG. 6A that is taken along line 6B-6B of FIG. 6A.

FIG. 6A is a schematic plan view that corresponds to FIG. 3C, that illustrates a power MOSFET 100C that is yet another modified version of the power MOSFET 100 of FIGS. 3A-3H. FIG. 6B is a schematic cross-sectional view of the power MOSFET 100C of FIG. 6A that is taken along line 6B-6B of FIG. 6A. Power MOSFET 100C is similar to power MOSFET 100B, except that in power MOSFET 100C, the trench shield connection patterns 154C are further shortened so that each trench shield connection pattern 154C only extends underneath a single gate trench 180.

It will be appreciated that power MOSFETs 100B and 100C may be further modified to omit the well contact regions 138 in the manner discussed above with reference to FIG. 4 to provide yet additional embodiments.

Figure 7A:
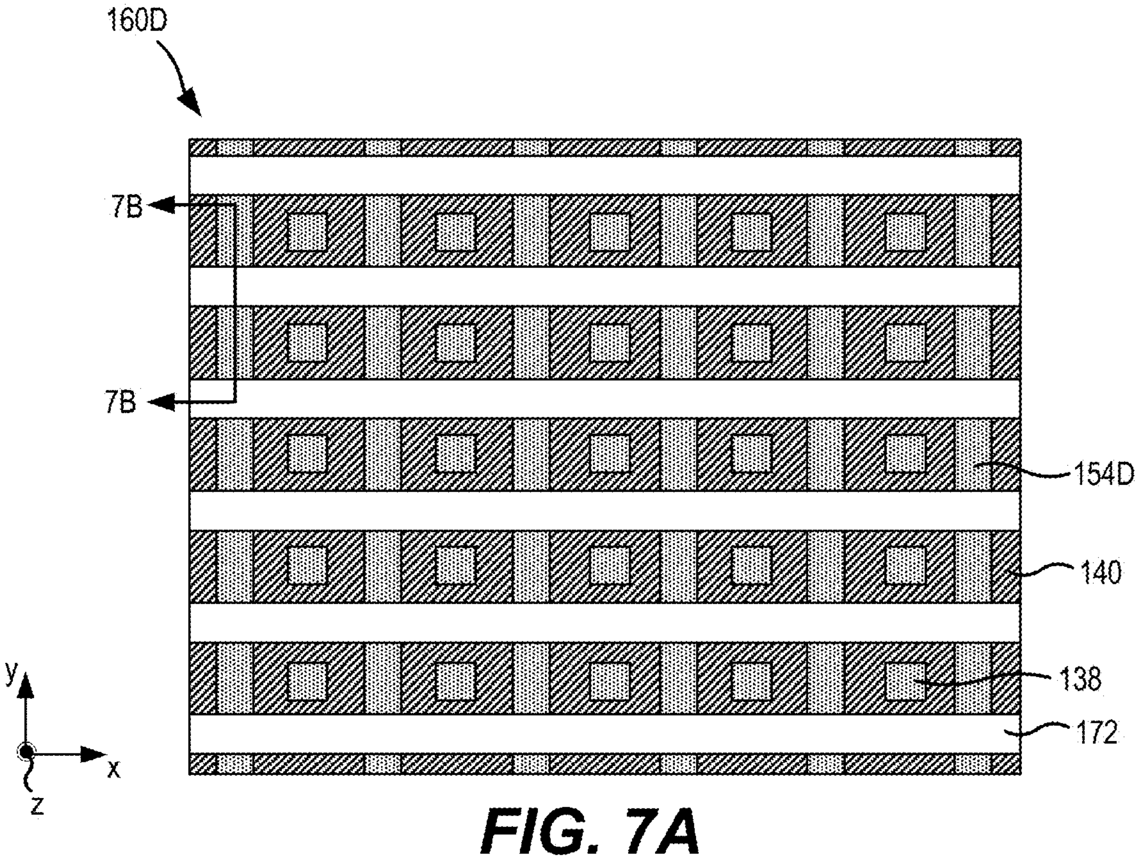
FIG. 7A is a schematic plan view that corresponds to FIG. 3C that illustrates still another modified version of the power MOSFET of FIGS. 3A-3H.
Figure 7B:
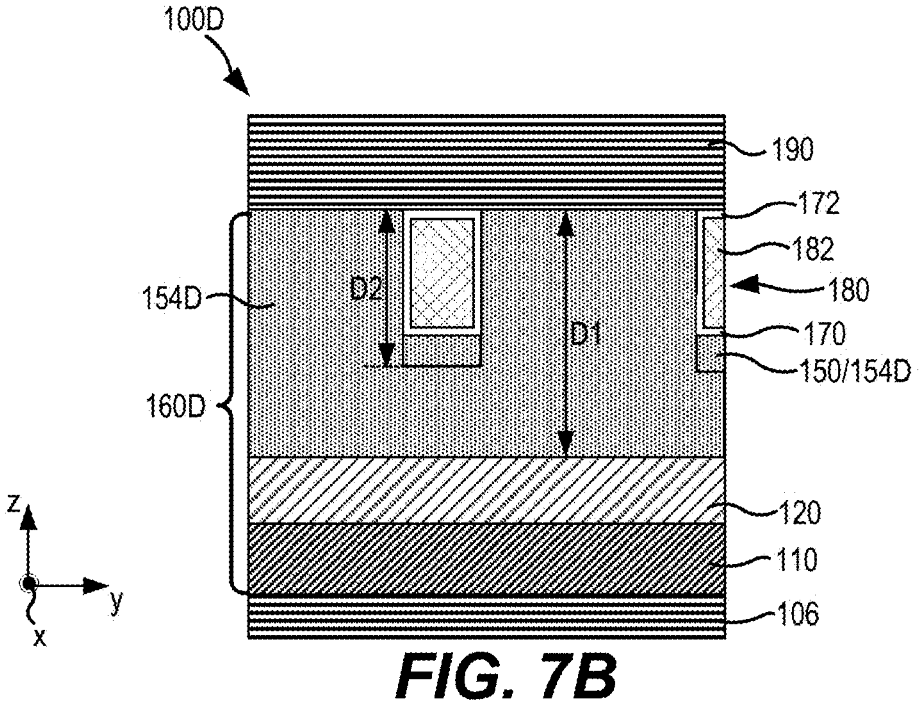
FIG. 7B is a schematic cross-sectional view of the power MOSFET of FIG. 7A that is taken along line 7B-7B of FIG. 7A.

FIG. 7A is a schematic plan view that corresponds to FIG. 3C that illustrates a power MOSFET 100D that is still another modified version of the power MOSFET of FIGS. 3A-3H. FIG. 7B is a schematic cross-sectional view of the power MOSFET 100D of FIG. 7A that is taken along line 7B-7B of FIG. 7A.

As shown in FIG. 7B, power MOSFET 100D includes trench shield connection patterns 154D that extend to a constant depth D1 into the semiconductor layer structure 160D. This constant depth D1 may be a depth that is deeper than a depth D2 that the trench shields 150 extend into the semiconductor layer structure 160D. The power MOSFET 100D may be fabricated by forming the trench shield connection patterns 154D via a deep ion implantation process (e.g., a channeled ion implantation process) before the gate trenches 180 are formed.

Figure 8A:
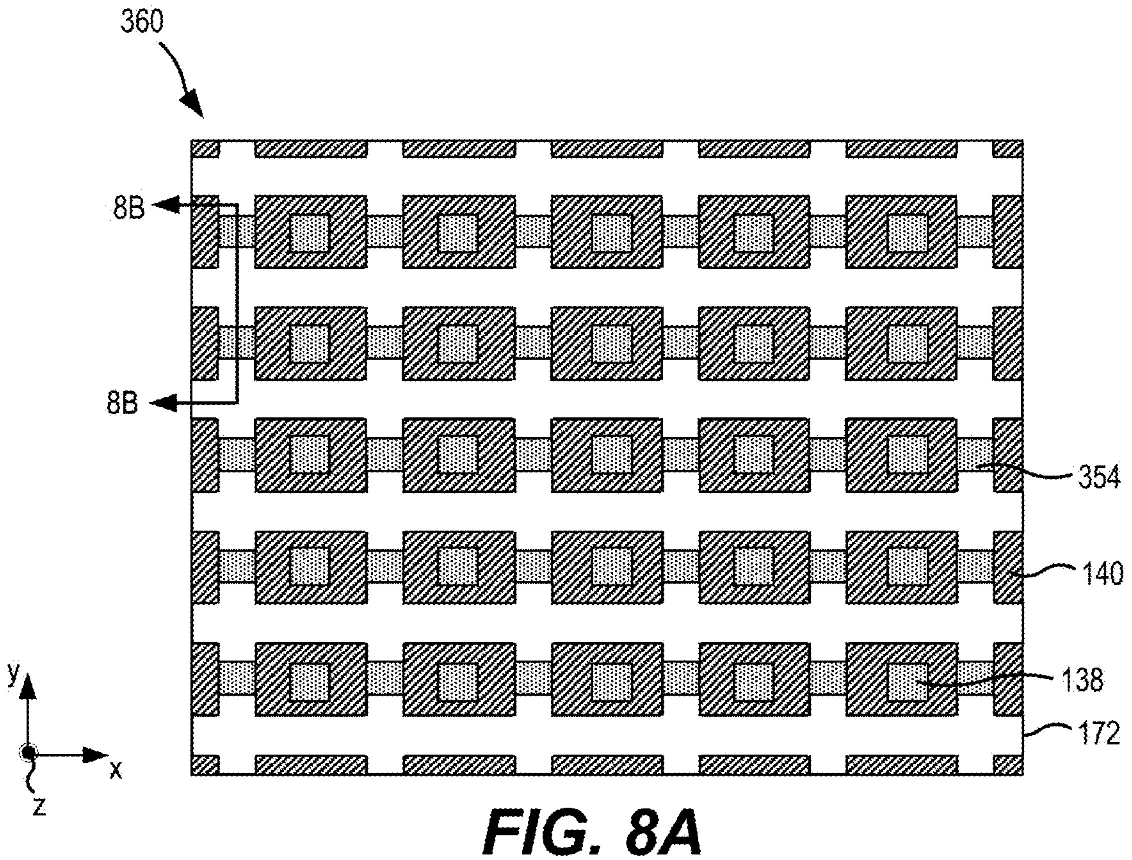
FIG. 8A is a schematic plan view of the portion of a power MOSFET according to further embodiments of the present invention, where the view of FIG. 8A corresponds to the portion of FIG. 3B shown in the box labelled A in FIG. 3B.
Figure 8B:
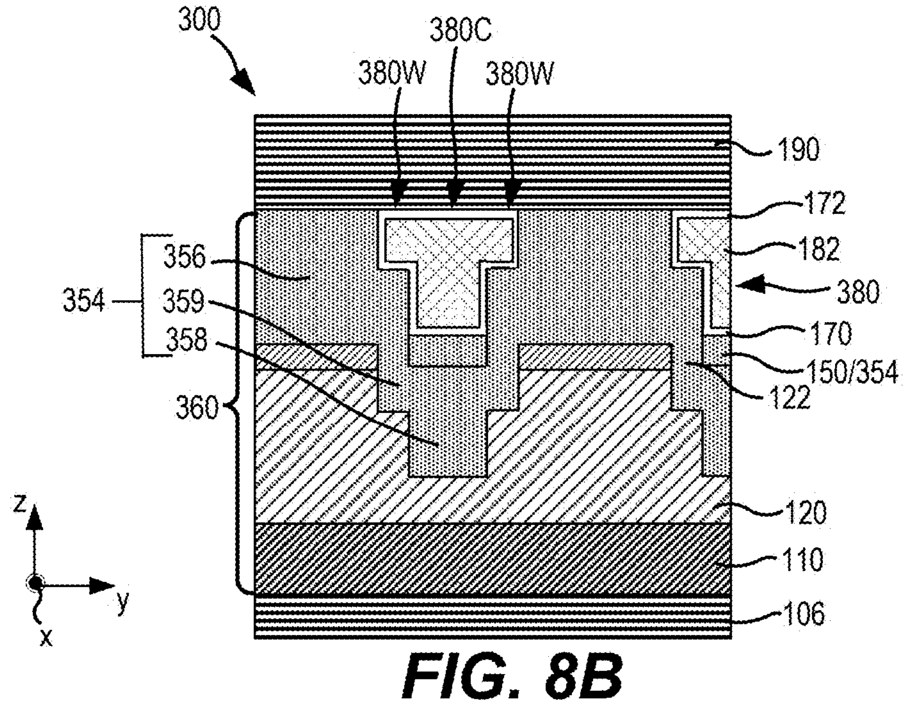
FIG. 8B is a schematic cross-sectional view of the power MOSFET of FIG. 8A that is taken along line 8B-8B of FIG. 8A.

As described above, the depth of each trench shield connection pattern (e.g., trench shield connection pattern 154) in the power semiconductor devices according to embodiments of the present invention may exceed the depth of the gate trenches 180. This may ensure that the first portions 156 of each trench shield connection pattern 154 are physically and electrically connected to the second portions 158. In some cases, however, this can lead to narrow connections between the first portions 156 and second portions 158 which can increase the resistance. In addition, there may be applications where it would be better if shallower trench shield connection patterns 154 were used that had implant depths that were less than the depth of the gate trenches 180. FIGS. 8A-8B illustrate a power MOSFET 300 according to further embodiments of the present invention that has trench shield connection patterns 354 that have implant depths that are less than the depth of the gate trenches 180.

FIG. 8A is a schematic plan view of the semiconductor layer structure 360 of power MOSFET 300 with the semiconductor, metal and dielectric layers that are above the semiconductor layer structure 360 omitted. FIG. 8B is a cross-sectional view taken along line 8B-8B of FIG. 8A, and corresponds to the cross-section of FIG. 3D of power MOSFET 100.

As can be seen by comparing FIG. 8B to FIG. 3D, power MOSFET 300 differs from power MOSFET 100 in that in power MOSFET 300, each gate trench 380 includes a plurality of widened sections 380W that are provided at the locations where the trench shielding connection patterns 354 cross the gate trenches. The widened sections 380W may be formed by performing an additional etching step (which may be performed either before or after the gate trenches 380 are formed). The widened sections 380W are not etched as deeply into the semiconductor layer structure 360 as the remainder of the gate trenches 380.

As shown in FIG. 8B, the trench shield connection patterns 354 may be formed after the gate trenches 380 including the widened sections 380W are formed. Each trench shield connection pattern 354 includes one or more first, second and third portions 356, 358, 359. The first portions 356 are in between adjacent gate trenches 380, the second portions 358 are underneath central portions of the gate trenches 380, and the third portions 359 are underneath the widened sections 380W of the gate trenches 380. The first and second portions 356, 358 of the trench shield connection patterns 354 are similar to the first and second portions 156, 158 of the trench shield connection patterns 154 of power MOSFET 100. However, because the widened sections 380W of the gate trenches 380 are recessed below the top surface of the semiconductor layer structure 360, the trench shield connection patterns 354 include the third portions 359 that extend deeper into the semiconductor layer structure 360 in the locations of the widened sections 380W, which allows the third portions 359 of the trench shield connection patterns 354 to horizontally overlap the second portions 358 of the trench shield connection patterns 354 to a greater extent, which helps ensure that a low resistance connection is provided to the second portions 358 of the trench shield connection patterns 354. Power MOSFET 300 may otherwise be identical to power MOSFET 100, and the cross-sections of FIGS. 3E-3H above accurately reflect the corresponding cross-section of power MOSFET 300. Herein, two elements, layers or regions of a semiconductor device "horizontally overlap" if an axis that extends parallel to a bottom surface of the semiconductor layer structure of the semiconductor device passes through both elements, layers or regions.

Figure 8C:
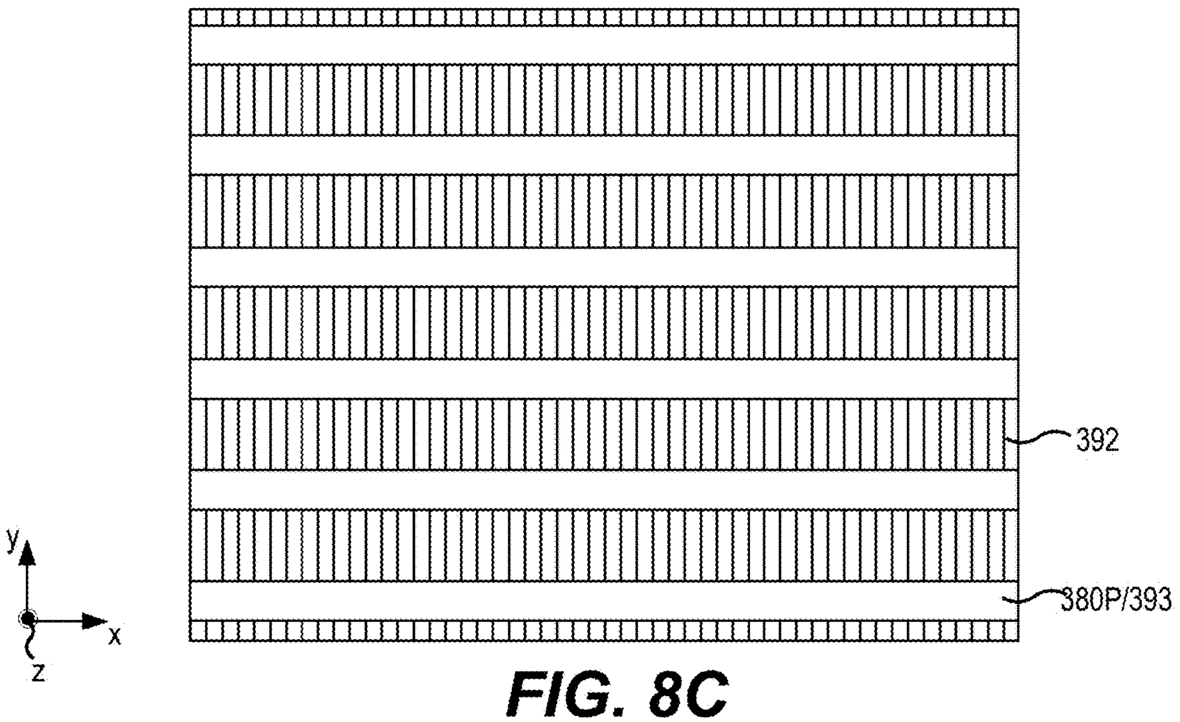
FIG. 8C is a plan view corresponding to FIG. 8A that illustrates a first etch mask that is used in the fabrication of the power MOSFET of FIGS. 8A-8B.

FIG. 8C is a plan view corresponding to FIG. 8A that illustrates a first etch mask 392 that is used in the fabrication of the power MOSFET of FIGS. 8A-8B. As shown in FIG. 8C, a first mask layer may be blanket formed over an upper surface of a portion of the semiconductor layer structure 360 that will become the active region of power MOSFET 300. The first mask layer may comprise, for example, an oxide mask layer. The first mask layer is then patterned (e.g., using a photolithography process) to form openings 393 therein to provide a first patterned mask 392. The openings 393 expose the portions of the upper surface of the semiconductor layer structure 360 in which the gate trenches 380 are to be formed. An etching step is then performed to form a plurality of preliminary gate trenches 380P in the semiconductor layer structure 360. The preliminary gate trenches 380P are formed in the locations where the gate trenches 380 will be formed but are not as deep as the gate trenches 380 that will ultimately be formed in the semiconductor layer structure 360.

Figure 8D:
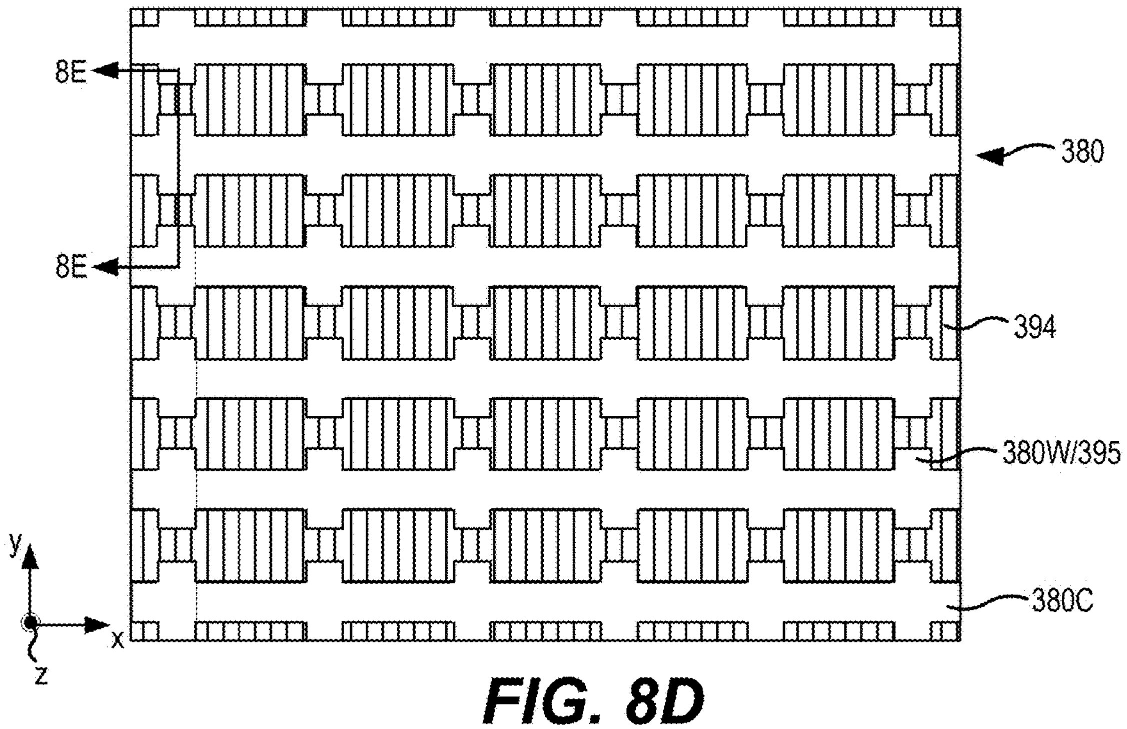
FIG. 8D is a plan view corresponding to FIG. 8A that illustrates a second etch mask that is used in the fabrication of the power MOSFET of FIGS. 8A-8B.

FIG. 8D is a plan view corresponding to FIG. 8A that illustrates a second etch mask 394 that is used in the fabrication of the power MOSFET of FIGS. 8A-8B. Referring to FIG. 8D, the first patterned mask 392 is left in place on the semiconductor layer structure 360 after formation of the preliminary gate trenches 380P. The first patterned mask 392 is then further patterned (e.g., using a photolithography process) to form openings 395 therein to convert the first patterned mask 392 into a second patterned mask 394 where the openings 395 expose the portions of the upper surface of the semiconductor layer structure 360 in which the widened portions 380W of the gate trenches 380 will be formed. An etching step is then performed to deepen the preliminary gate trenches 380P and to etch a plurality of openings 395 in the semiconductor layer structure 360 to form the widened sections 380W of the gate trenches 380. This etching process converts the preliminary gate trenches 380P into the gate trenches 380. The openings 395 may be arranged in a plurality of columns, where the columns cross the preliminary gate trenches 380P. In some embodiments, the openings 395 may not extend as deeply into the semiconductor layer structure 360 as the preliminary gate trenches 380P, although embodiments of the present invention are not limited thereto.

Figure 8E:
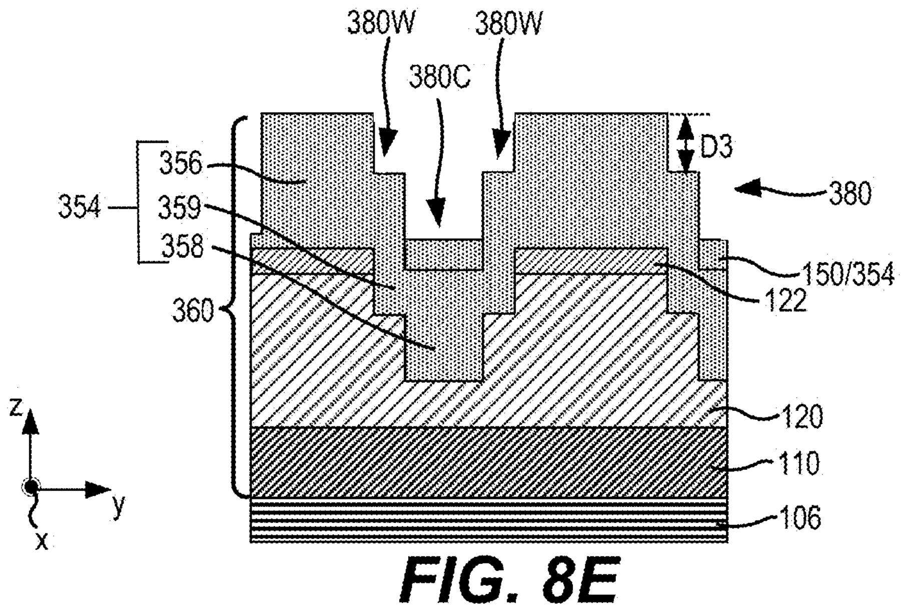
FIG. 8E is a schematic cross-sectional view that is taken along line 8E-8E of FIG. 8D.

FIG. 8E is a schematic cross-sectional view that is taken along line 8E-8E of FIG. 8D (but after the trench shields 150 and the trench shield connection patterns 354 are formed). As shown in FIG. 8E, after the etching steps discussed above with respect to FIGS. 8C and 8D are performed, a plurality of gate trenches 380 are formed in the semiconductor layer structure 360. Each gate trench 380 includes a central section 380C that extends as a continuous trench having a constant depth into the semiconductor layer structure 360 and a plurality of pairs of widened sections 380W. Each pair of widened sections 380W includes a widened section 380W on either side of the central section 380C of a respective one of the gate trenches 380. A plurality of pairs of widened sections 380W are provided along each gate trench 380 and are spaced apart from each other along the longitudinal dimension of each gate trench 380. As shown on FIG. 8E, after the gate trenches 380 are formed, the trench shield connection patterns 354 are formed via ion implantation in the same manner that the trench shield connection patterns 154 are formed.

As can be seen in FIG. 8E, since the upper surface of the semiconductor layer structure 360 is recessed in the locations of the widened sections 380W, the ion implantation process that is used to form the trench shield connection patterns 354 implants the p-type dopant ions more deeply into the semiconductor layer structure 360 in the regions where the widened sections 380W are formed. As a result, each trench shield connection pattern 354 includes the first through third portions 356, 358, 359 that extend to different depths into the semiconductor layer structure 360, where the first portions 356 extend to the upper surface of the semiconductor layer structure 360 and have the shallowest depths into the semiconductor layer structure 360, the second portions 358 are underneath the central portions 380C of the gate trenches 380 and have the deepest depths into the semiconductor layer structure 360, and the third portions 359 are underneath the widened sections 380W of the gate trenches 380 and have intermediate depths. Notably, the third portions 359 and the second portions 358 have significant horizontal overlap, thereby providing low resistivity connection from the source metallization layer 190 (not shown) to the third portions 359 of the trench shield connection patterns 354 and the trench shields 150. Moreover, the resistance of these connections may be readily adjusted by adjusting the depth D3 shown in FIG. 8E which corresponds to the depth of the widened sections 380W of the gate trenches 380.

As discussed above with respect to FIG. 2, in conventional power MOSFET 1 the trench shields 50 are typically formed using a low energy ion implantation process that reduces/minimizes damage to the semiconductor layer structure and that also does not extend the trench shield very far into the drift region. The shallower trench shields allow the current to readily spread laterally during on-state operation, which may reduce the on-state resistance. It has been discovered, however, that this approach may not provide optimum performance. For example, if a lower dose ion implantation step is performed to form the trench shields 50, during reverse bias operation increased gate leakage (i.e., drain-to-gate current) will occur since the lower dopant concentration less effectively blocks the electric fields during reverse bias operation. This gate leakage during reverse blocking operation may be suppressed by increasing the doping concentration of the trench shields (by using a high dose ion implantation step), but the highly-doped trench shields will exhibit increased drain-to-source leakage during reverse bias operation, which is also undesirable.

It has been discovered that improved performance may be obtained by forming the trench shields using a high energy, medium dose ion implantation step. The deeper, medium dose trench shields may more effectively block the electric fields extending upward from the drain during reverse bias operation, thereby suppressing gate leakage. In addition, the trench shields may suppress drain-source leakage currents during reverse blocking operation by orders of magnitude as compared to the above-described conventional trench shields, as shown in FIG. 10.

Figure 9:
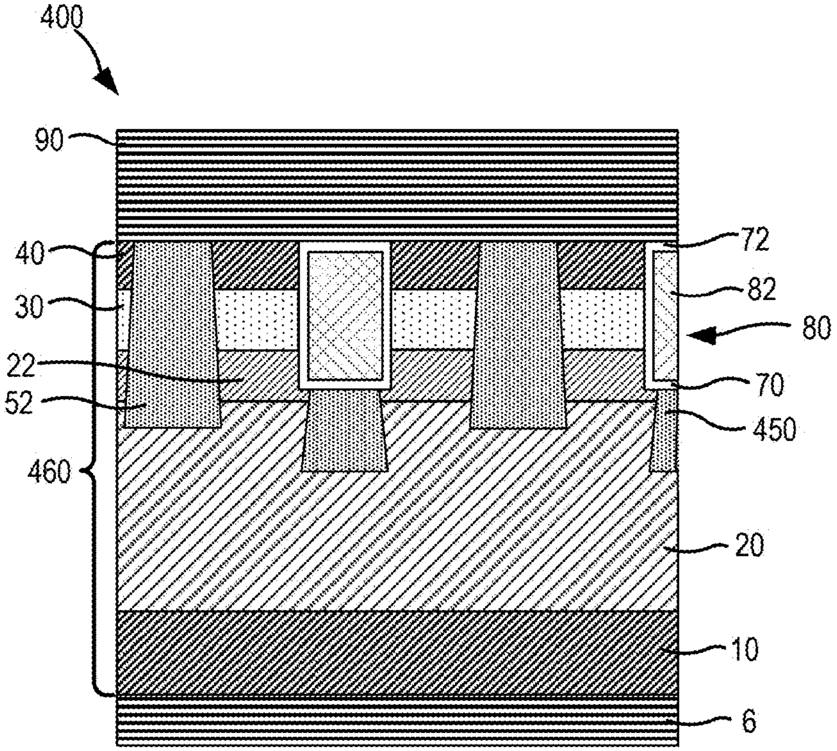
FIG. 9 is a schematic cross-sectional view of a power MOSFET according to further embodiments of the present invention.

FIG. 9 is a schematic cross-sectional view of a power MOSFET 400 according to further embodiments of the present invention that includes trench shields 450 that are formed using a high energy, medium dose ion implantation step. FIG. 9 corresponds to the cross-section of FIG. 3D of power MOSFET 100. As can be seen by comparing power MOSFET 400 to the conventional power MOSFET 1 of FIG. 2, the only difference between the two power MOSFETs 1, 400 may be the use of a semiconductor layer structure 460 that has deeper, medium dose trench shields 450 in power MOSFET 400. Accordingly, the same reference numerals are mostly used in FIG. 9 that are used in FIG. 2 as the elements having the same reference numerals may be identical.

The depth and doping concentration of the trench shields 450 in power MOSFET 400 may be a function of the rated blocking voltage for the device. In example embodiments, the trench shields 450 may extend through the JFET layer 22 and into the more lightly-doped portion of the drift region 20. For power MOSFETs 400 having a blocking voltage rating of between 500 and 3000 volts, the trench shields 450 may extend to depths of between 0.1 and 10 microns into the semiconductor layer structure 460 and may have p-type doping concentrations of between $1\times10^{17}$ and $1\times10^{19}$ dopants/$cm^3$. In other example embodiments, the trench shields 450 may extend to depths of between 2-8 microns, between 4-6 microns, between 1-4 microns, between 2-6 microns or between 4-8 microns into the semiconductor layer structure 460. In other embodiments, power MOSFET 400 may have a blocking voltage rating of between 500 and 1200 volts, between 1500 and 3000 volts, between 1000 and 2000 volts or between 1000 and 1500 volts. In other embodiments, the p-type doping concentration the trench shields 450 may be between $1\times10^{17}$ and $1\times10^{18}$ dopants/$cm^3$ or between $1\times10^{18}$ and $1\times10^{19}$ dopants/$cm^3$. Any of the above blocking voltage ranges may be combined with any of the above listed depths for the trench shields 450 and/or with any of the above doping concentrations for the trench shields 450 to provide many additional embodiments.

Figure 10:
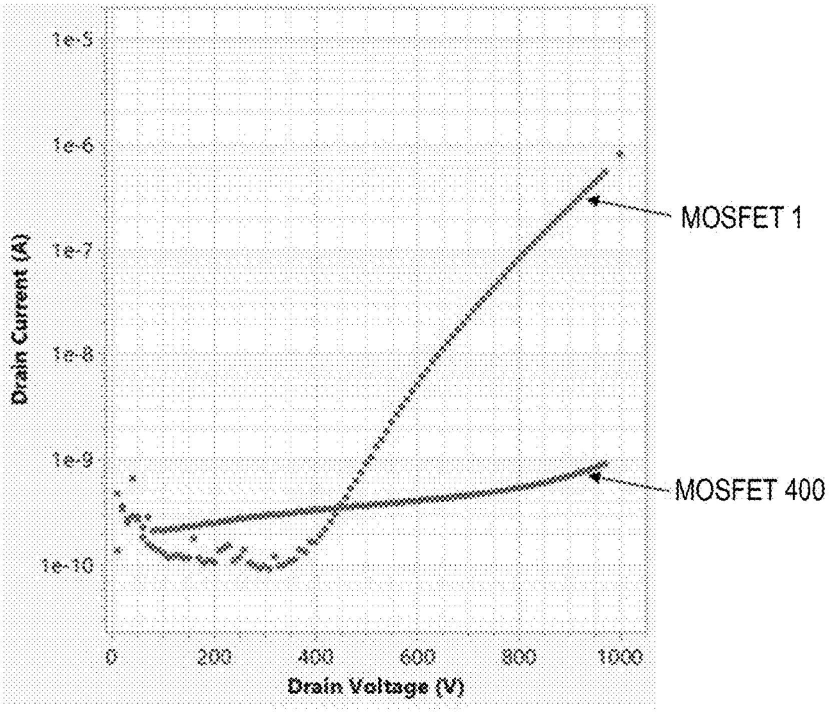
FIG. 10 is a graph illustrating the drain-to-source leakage current during reverse blocking operation as a function of the drain-to-source voltage for the power MOSFET of FIG. 9 as compared to a comparable power MOSFET that has a conventional trench shield design.

FIG. 10 is a graph illustrating the drain-to-source leakage current during reverse blocking operation as a function of the drain-to-source voltage for the power MOSFET of FIG. 9 as compared to a comparable power MOSFET that has a conventional trench shield design. As can be seen from FIG. 10, the drain-to-source leakage current during reverse bias operation is several orders of magnitude lower for power MOSFET 400 as compared to power MOSFET 1.

The power MOSFET 400 includes support shields 52. It will be appreciated that in other embodiments the support shields 52 may be omitted and the unit cells located closer together.

Figure 11:
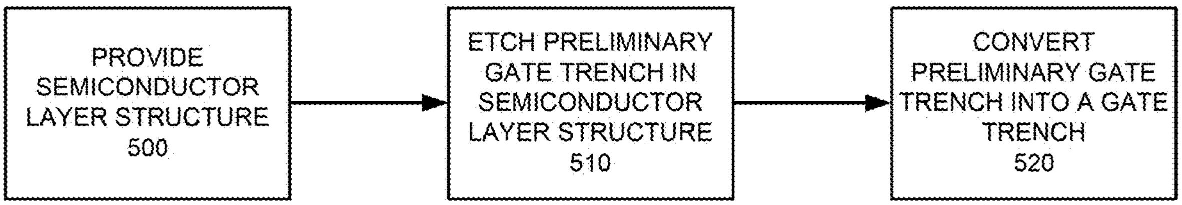
FIG. 11 is a flow chart illustrating a method of fabricating a power MOSFET according to embodiments of the present invention.

FIG. 11 is a flow chart illustrating a method of fabrication a power MOSFET 300 of FIGS. 8A-8B according to certain embodiments of the present invention. As shown in FIG. 11, operations may begin by providing a semiconductor layer structure that comprises a drift region having a first conductivity type and a well region having a second conductivity type. (Block 500). Next, the semiconductor layer structure may be etched to form a preliminary gate trench therein, the gate trench having a longitudinal axis that extends in a first direction (Block 510). Thereafter, the semiconductor layer structure may be further etched to deepen the preliminary gate trench and to simultaneously form a plurality of additional openings in the semiconductor layer structure to convert the preliminary gate trench into a gate trench that has a central section that has a first depth and a plurality of widened second sections that have a second depth (Block 520). In some embodiments, the same etch mask may be used for the etching steps of Blocks 510 and 520, although the etch mask is further patterned after the etching step of Block 510 and before the etching step of Block 520).

In the description above, each example embodiment has a certain conductivity type. It will be appreciated that opposite conductivity type devices may be formed by simply reversing the conductivity of the n-type and p-type layers in each of the above embodiments. Thus, it will be appreciated that the present invention covers both n-channel and p-channel devices for each different device structure (e.g., MOSFET, IGBT, etc.).

The present invention has primarily been discussed above with respect to silicon carbide based power semiconductor devices. It will be appreciated, however, that silicon carbide is used herein as an example and that the devices discussed herein may be formed in any appropriate wide band-gap semiconductor material system. As an example, gallium nitride based semiconductor materials (e.g., gallium nitride, aluminum gallium nitride, etc.) may be used instead of silicon carbide in any of the embodiments described above.

References are made herein to a first element extending deeper into a semiconductor layer structure of a gate trench semiconductor device than a second element. The depth that an element extends into a semiconductor layer structure refers to a distance that the element extends from an upper surface of the semiconductor layer structure, where the upper surface is the surface from which the gate trenches extend into the semiconductor layer structure. Thus, if a first element extends deeper into a semiconductor layer structure than a second element, this means that a lowermost surface of the first element is farther from the upper surface of the semiconductor layer structure than is a lowermost surface of the second element.

Embodiments of the present invention have been described above with reference to the accompanying drawings, in which embodiments of the invention are shown. It will be appreciated, however, that this invention may, however, be embodied in many different forms and should not be construed as limited to the embodiments set forth above. Rather, these embodiments are provided so that this disclosure will be thorough and complete, and will fully convey the scope of the invention to those skilled in the art. Like numbers refer to like elements throughout.

Herein, the term “plurality” means two or more. Herein, “substantially” means within +/−10%.

It will be understood that, although the terms first, second, etc. are used throughout this specification to describe various elements, these elements should not be limited by these terms. These terms are only used to distinguish one element from another. For example, a first element could be termed a second element, and, similarly, a second element could be termed a first element, without departing from the scope of the present invention. The term “and/or” includes any and all combinations of one or more of the associated listed items.

The terminology used herein is for the purpose of describing particular embodiments only and is not intended to be limiting of the invention. As used herein, the singular forms “a”, “an” and “the” are intended to include the plural forms as well, unless the context clearly indicates otherwise. It will be further understood that the terms “comprises” “comprising,” “includes” and/or “including” when used herein, specify the presence of stated features, integers, steps, operations, elements, and/or components, but do not preclude the presence or addition of one or more other features, integers, steps, operations, elements, components, and/or groups thereof.

It will be understood that when an element such as a layer, region or substrate is referred to as being “on” or extending “onto” another element, it can be directly on or extend directly onto the other element or intervening elements may also be present. In contrast, when an element is referred to as being “directly on” or extending “directly onto” another element, there are no intervening elements present. It will also be understood that when an element is referred to as being “connected” or “coupled” to another element, it can be directly connected or coupled to the other element or intervening elements may be present. In contrast, when an element is referred to as being “directly connected” or “directly coupled” to another element, there are no intervening elements present.

Relative terms such as “below” or “above” or “upper” or “lower” or “top” or “bottom” may be used herein to describe a relationship of one element, layer or region to another element, layer or region as illustrated in the figures. It will be understood that these terms are intended to encompass different orientations of the device in addition to the orientation depicted in the figures.

Embodiments of the invention are described herein with reference to cross-section illustrations that are schematic illustrations of idealized embodiments (and intermediate structures) of the invention. The thickness of layers and regions in the drawings may be exaggerated for clarity. Additionally, variations from the shapes of the illustrations as a result, for example, of manufacturing techniques and/or tolerances, are to be expected. Embodiments of the invention are also described with reference to a flow chart. It will be appreciated that the steps shown in the flow chart need not be performed in the order shown.

Some embodiments of the invention are described with reference to semiconductor layers and/or regions which are characterized as having a conductivity type such as n-type or p-type, which refers to the majority carrier concentration in the layer and/or region. Thus, n-type material has a majority equilibrium concentration of negatively charged electrons, while p-type material has a majority equilibrium concentration of positively charged holes. Some material may be designated with a “+” or “−” (as in n+, n−, p+, p−, n++, n−−, p++, p−−, or the like), to indicate a relatively larger (“+”) or smaller (“−”) concentration of majority carriers compared to another layer or region. However, such notation does not imply the existence of a particular concentration of majority or minority carriers in a layer or region.

In the drawings and specification, there have been disclosed typical embodiments of the invention and, although specific terms are employed, they are used in a generic and descriptive sense only and not for purposes of limitation, the scope of the invention being set forth in the following claims.

That Which is claimed is:

1. A semiconductor device, comprising:
- a semiconductor layer structure that has a gate trench therein; and
- a source metallization layer on the semiconductor layer structure,
- wherein the semiconductor layer structure comprises:
  - a drift region having a first conductivity type;
  - a trench shield that has a second conductivity type, the trench shield positioned underneath the gate trench; and
  - a trench shield connection pattern that has the second conductivity type, the trench shield connection pattern electrically connecting the trench shield to the source metallization layer, where the trench shield connection pattern extends deeper into the semiconductor layer structure than the trench shield.

2. The semiconductor device of claim 1, wherein the trench shield connection pattern extends below and vertically overlaps the trench shield.

3. The semiconductor device of claim 1, wherein a longitudinal axis of the gate trench extends in a first direction, and a longitudinal axis of the trench shield connection pattern extends in a second direction that is perpendicular to the first direction.

4. The semiconductor device of claim 1, wherein the gate trench is one of a plurality of gate trenches, the trench shield is one of a plurality of trench shields that extend underneath the respective gate trenches, and the trench shield connection pattern is one of a plurality of trench shield connection patterns, and the gate trenches extend in parallel to each other, the semiconductor device further comprising a plurality of gate electrodes in the respective gate trenches.

5. The semiconductor device of claim 4, wherein each trench shield connection pattern crosses below multiple of the gate trenches.

6. The semiconductor device of claim 4, wherein the semiconductor layer structure further comprising a plurality of well regions that have the second conductivity type on the drift region and a plurality of source regions that have the first conductivity type on the respective well regions opposite the drift region.

7. The semiconductor device of claim 6, wherein the semiconductor layer structure further comprises a plurality of well contact regions having the second conductivity type on the respective well regions opposite the drift region, the well contact regions having a doping concentration that is at least five times greater than a doping concentration of the well regions.

8. The semiconductor device of claim 7, wherein the well contact regions are arranged in a plurality of columns and rows when the semiconductor layer structure is viewed in plan view, and each well contact region is surrounded by a respective one of the source regions when the semiconductor layer structure is viewed in plan view.

9. The semiconductor device of claim 8, wherein each column of well contact regions extends in between a respective pair of trench shield connection patterns.

10. A semiconductor device, comprising:
- a semiconductor layer structure that comprises a drift region having a first conductivity type, well region having a second conductivity type positioned above the drift region, a trench shield having the second conductivity type and has a longitudinal axis that extends in a first direction, and a trench shield connection pattern that has the second conductivity type and has a longitudinal axis that extends in a second direction that is different than the first direction,
- wherein a portion of the trench shield connection pattern extends deeper into the semiconductor layer structure than the trench shield.

11. The semiconductor device of claim 10, wherein the semiconductor layer structure has a plurality of gate trenches therein that extend in the first direction, the semiconductor device further comprising a plurality of gate electrodes in the respective gate trenches.

12. The semiconductor device of claim 11, wherein the trench shield connection pattern is one of a plurality of trench shield connection patterns that have the second conductivity type, and at least some of the trench shield connection patterns cross below multiple of the gate trenches.

13. The semiconductor device of claim 11, wherein a first of the trench shield connection patterns includes a first portion that is in between first and second of the gate trenches and a second portion that extends underneath at least the first gate trench.

14. The semiconductor device of claim 13, wherein the second portion of the first trench shield connection pattern extends further into the semiconductor layer structure than the first portion of the first trench shield connection pattern, and the first portion of the first trench shield connection pattern extends to an upper surface of the semiconductor layer structure.

15. The semiconductor device of claim 11, wherein each gate trench includes a central section that extends to a first depth in the semiconductor layer structure, and further has a plurality of widened sections that are on at least one side of the central section and spaced-apart from each other.

16. The semiconductor device of claim 15, wherein each widened section extends to a second depth in the semiconductor layer structure that is less than the first depth.

17. A semiconductor device, comprising:
- a semiconductor layer structure that has a gate trench therein, the gate trench having a longitudinal axis that extends in a first direction, the semiconductor layer structure comprising:
  - a drift region having a first conductivity type;
  - a trench shield that has the second conductivity type extending underneath the gate trench; and
  - a trench shield connection pattern that has the second conductivity type, the trench shield connection pattern including a first portion that extends to an upper surface of the semiconductor layer structure and a second portion that extends through and underneath the trench shield.

18. The semiconductor device of claim 17, wherein the gate trench is one of a plurality of gate trenches, and the trench shield connection pattern extends below and vertically overlaps at least two of the gate trenches.

19. The semiconductor device of claim 17, wherein the second portion of the trench shield connection pattern extends deeper into the semiconductor layer structure than the first portion of the trench shield connection pattern.

20. The semiconductor device of claim 17, wherein the second portion of the trench shield connection pattern extends to the same depth into the semiconductor layer structure as the first portion of the trench shield connection pattern.

* * * * *